United States Patent [19]
Ito et al.

[11] Patent Number: 5,866,280
[45] Date of Patent: *Feb. 2, 1999

[54] EXPOSURE MASK AND MANUFACTURING METHOD THEREOF

[75] Inventors: Shinichi Ito, Yokohama; Kenji Kawano, Tokyo; Soichi Inoue, Yokohama; Satoshi Tanaka, Kawasaki, all of Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 710,408

[22] Filed: Sep. 17, 1996

[30] Foreign Application Priority Data

Sep. 18, 1995 [JP] Japan ................................ 7-238751

[51] Int. Cl.$^6$ ........................................ G03F 9/00
[52] U.S. Cl. ................................. 430/5; 430/323
[58] Field of Search .................. 430/5, 322, 323, 430/324; 156/651, 653

[56] References Cited

U.S. PATENT DOCUMENTS 5,225,035  7/1993  Rolfson ............................. 156/643
5,300,379  4/1994  Dao et al. .......................... 430/5
5,348,826  9/1994  Dao et al. .......................... 430/5
5,514,498  5/1996  Nakagawa .......................... 430/5
5,538,815  7/1996  Oi et al. ............................ 430/5
5,549,995  8/1996  Tanaka et al. ...................... 430/5

FOREIGN PATENT DOCUMENTS 62 189468  8/1987  Japan .
62  50811  10/1987  Japan .

OTHER PUBLICATIONS

J. Vac. Sci. Technol. B, vol. 10, No. 6, pp. 3055–3061, Nov/Dec 1992, R. L. Kostelak, et al., "Exposure Characteristics of Alternate Aperture Phase–Shifting Masks Fabricated Using A Subtractive Process".

Primary Examiner—S. Rosasco
Attorney, Agent, or Firm—Oblon, Spivak, McClelland, Maier & Neustadt, P.C.

[57] ABSTRACT

An exposure mask comprises a phase shift section including a plurality of opening patterns formed by making openings in part of a shading film provided on a transmissive substrate and digging part of the substrate, and a non-phase shift section including at least one opening pattern. The opening pattern of the non-phase shift section has a dig whose amount of digging has been adjusted according to the amount of digging in the opening patterns of the phase shift section.

3 Claims, 16 Drawing Sheets

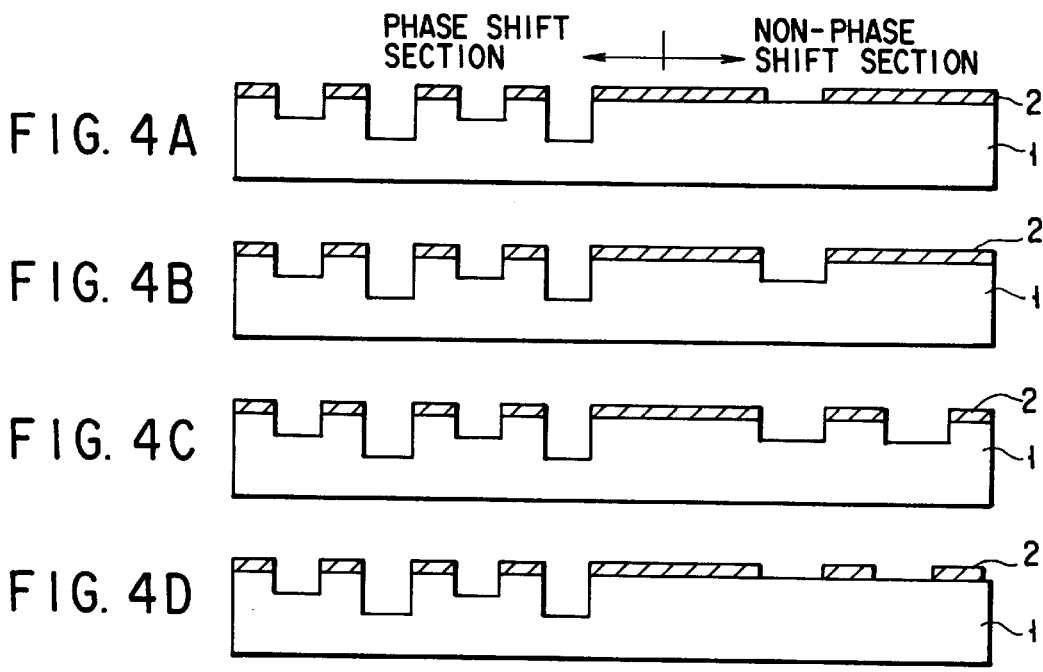
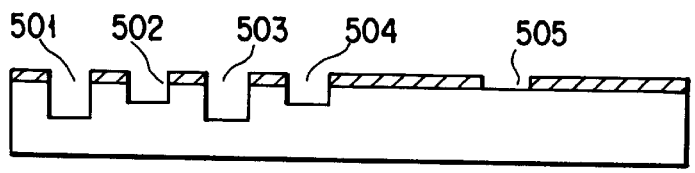
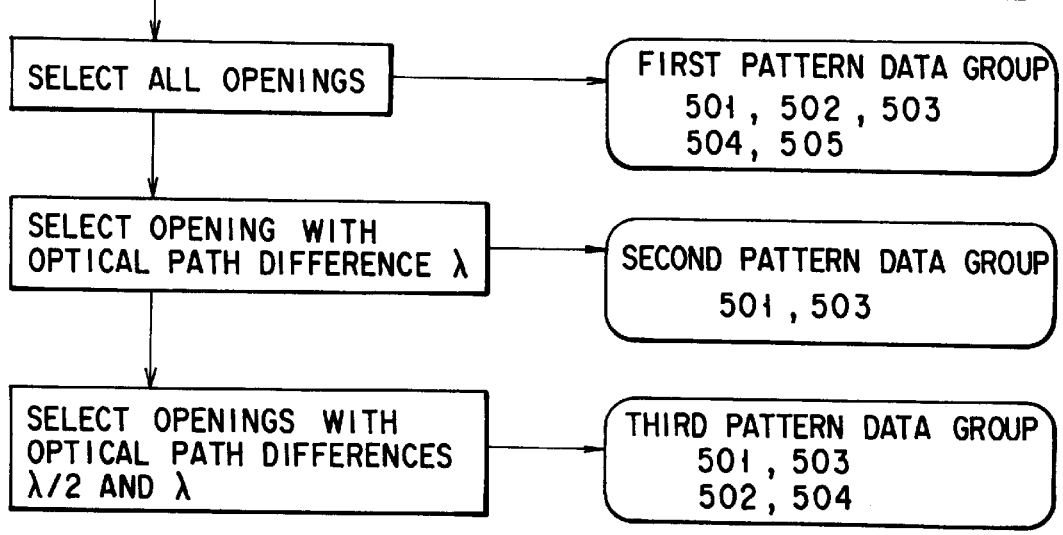
FIG. 5

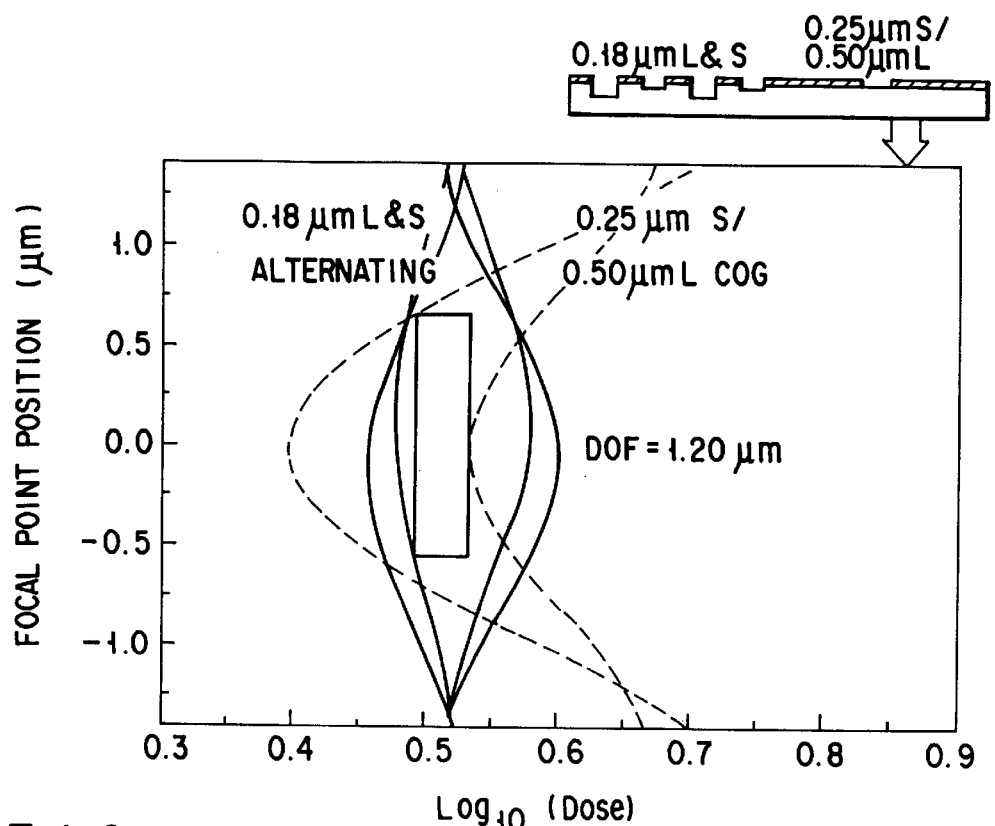
F I G. 10A
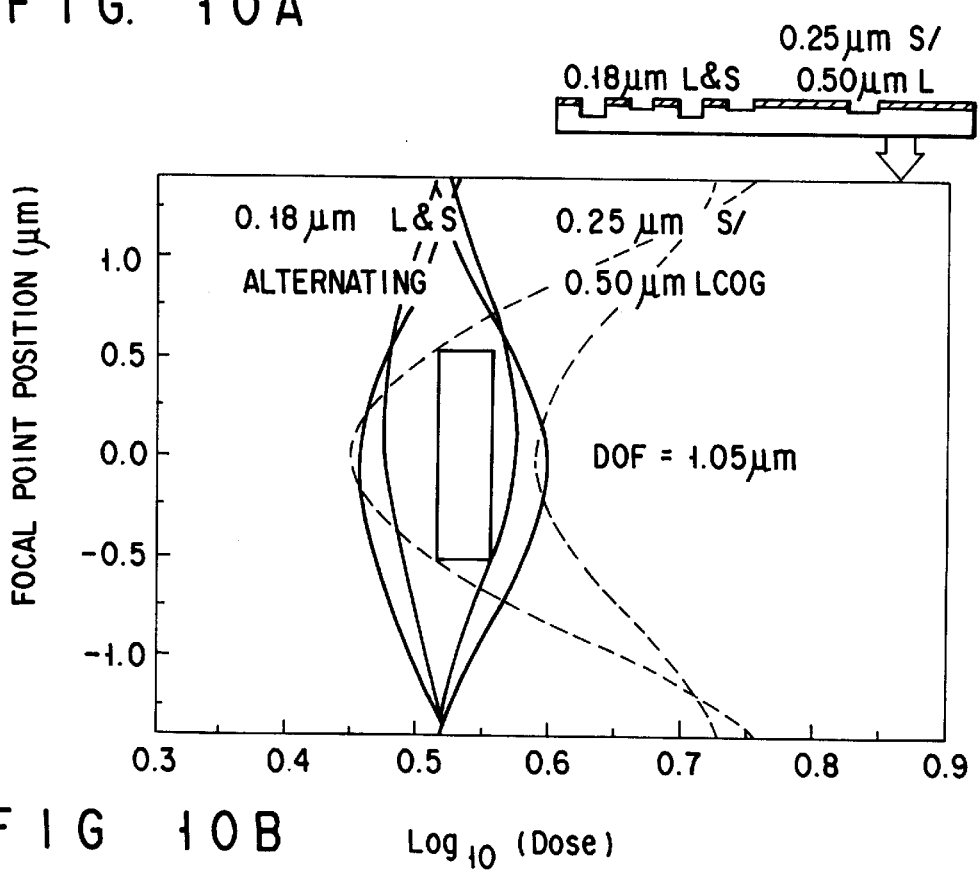
F I G 10B

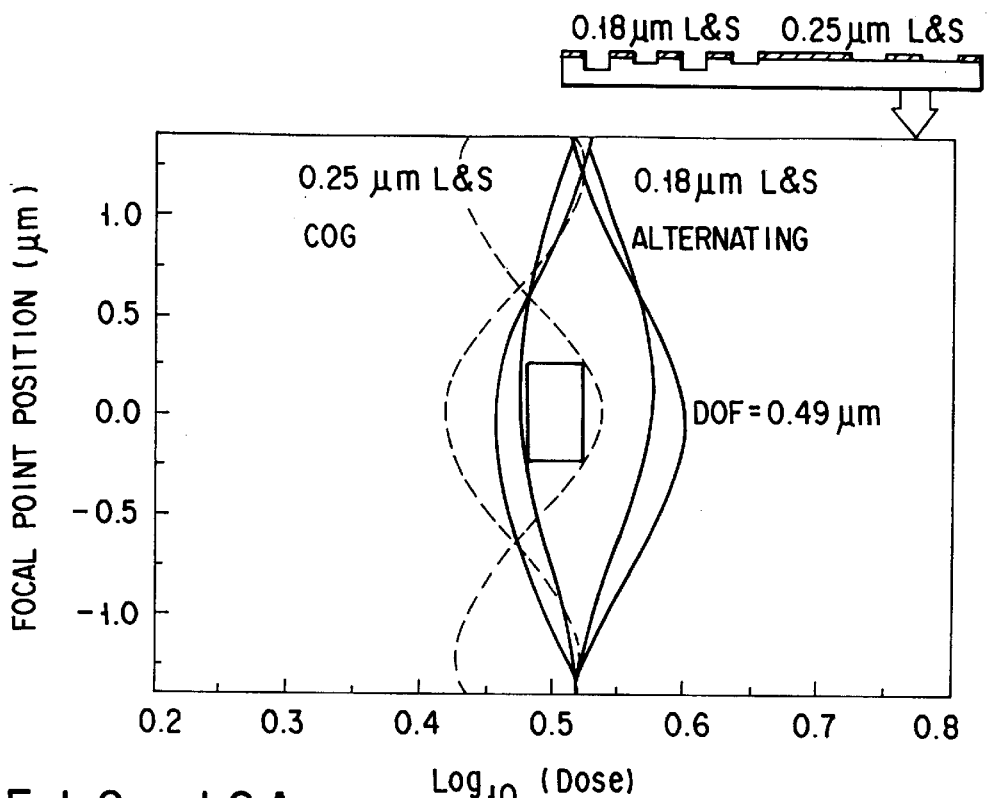
F I G. 12A
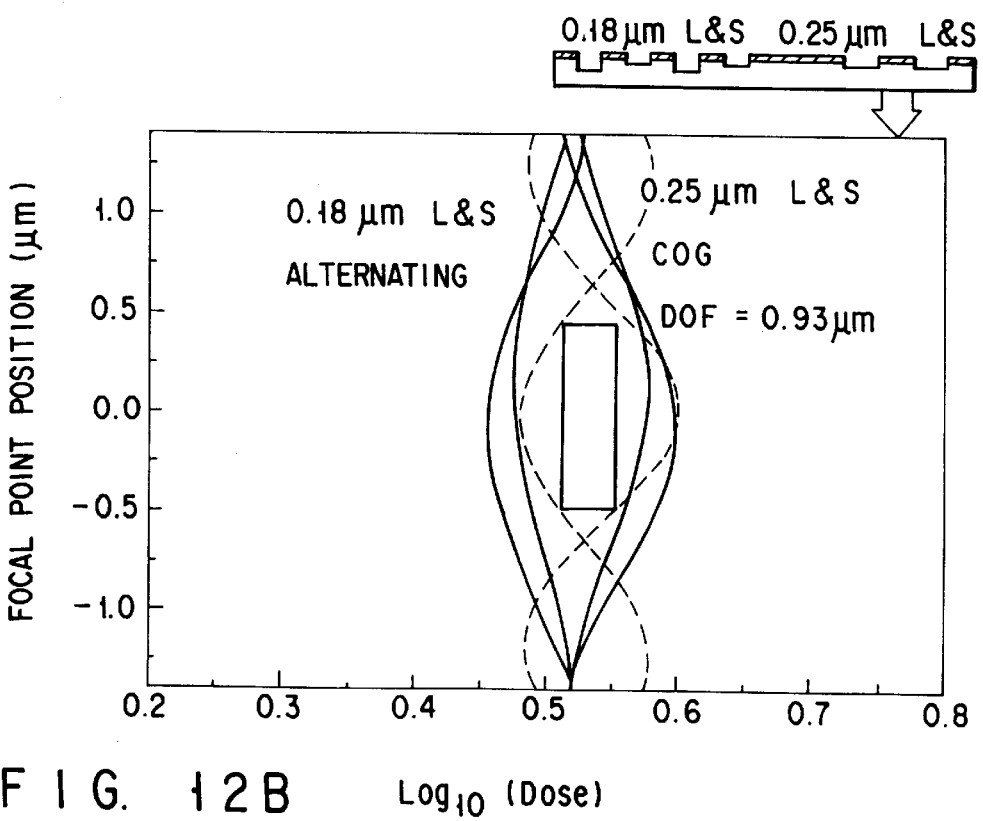
F I G. 12B

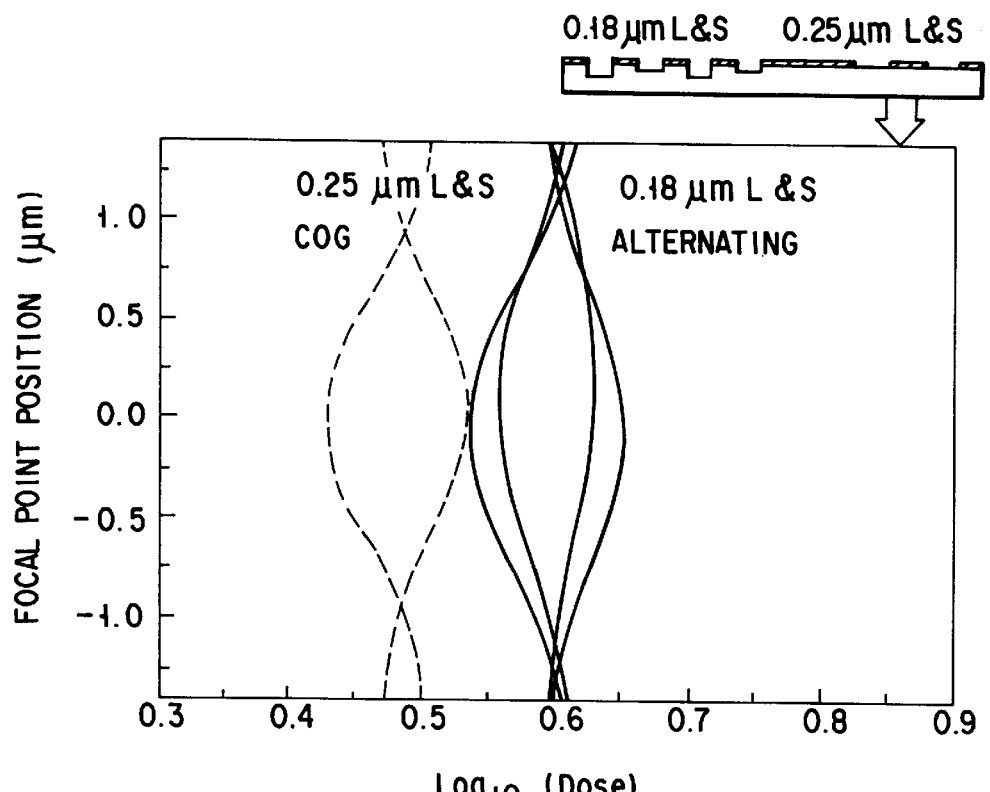
F I G. 14A
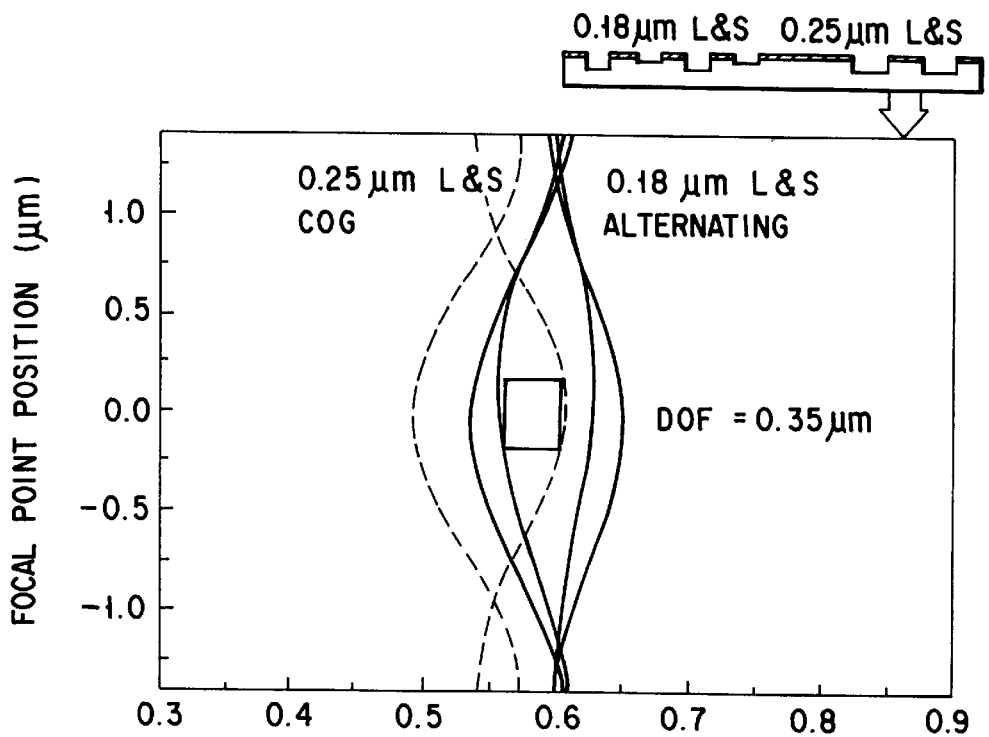
F I G. 14B

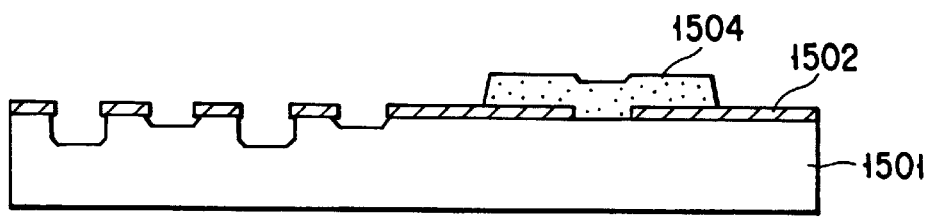
F I G. 16A
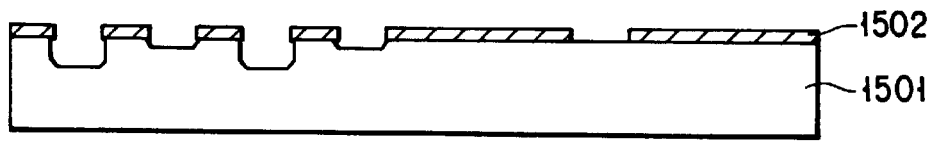
F I G. 16B
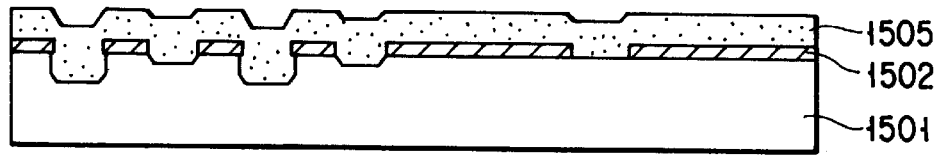
F I G. 16C
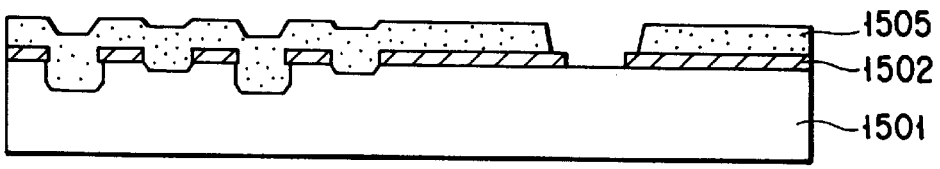
F I G. 16D
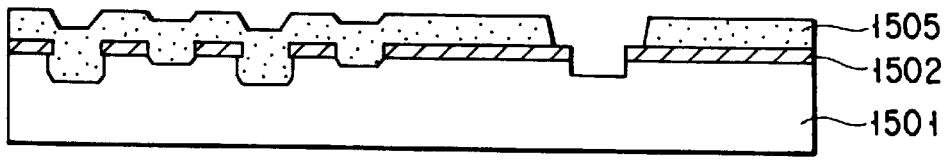
F I G. 16E
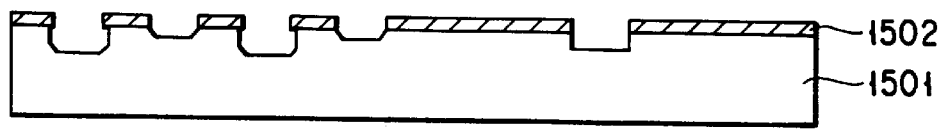
F I G. 16F

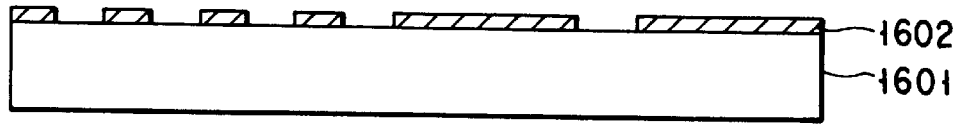
F I G. 17A
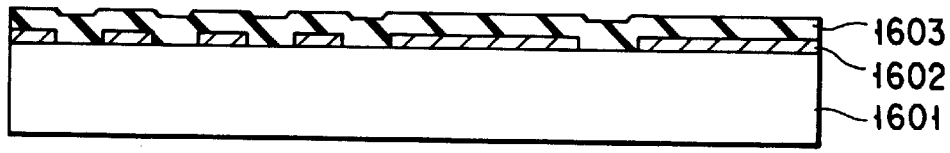
F I G. 17B
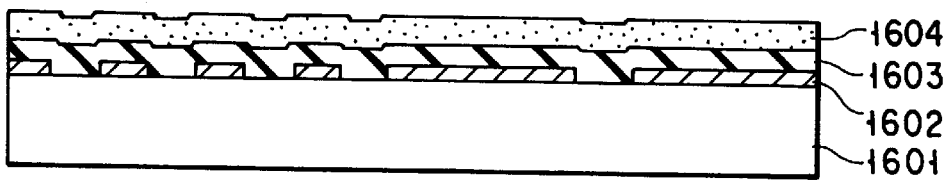
F I G. 17C
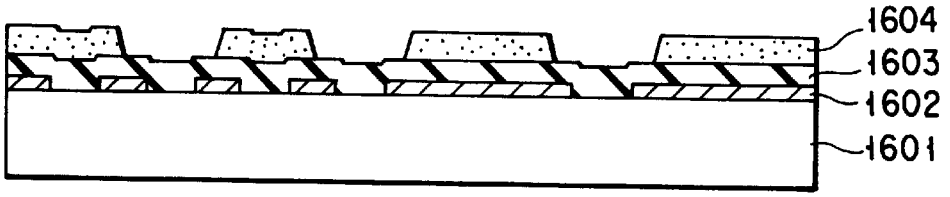
F I G. 17D
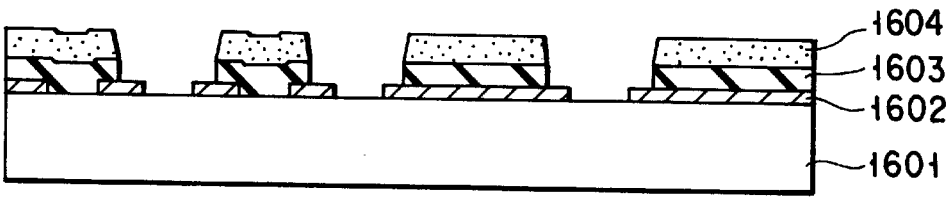
F I G. 17E
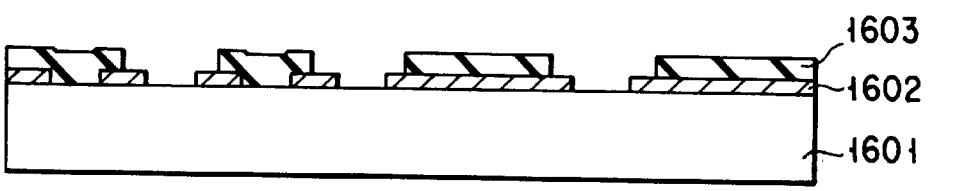
F I G. 17F

EXPOSURE MASK AND MANUFACTURING METHOD THEREOF

BACKGROUND OF THE INVENTION

1. Field of the Invention

This invention relates to photolithographic techniques used for lithography processes in the manufacture of semiconductor devices, and more particularly to exposure masks using the phase shift effect and a manufacturing method thereof.

2. Description of the Related Art

With the recent advances in semiconductor technology, semiconductor devices have been made faster and more highly integrated, giving rise to the need of making pattern dimensions much finer and more accurate. To meet these requirements, short wavelength light, such as far ultraviolet light, has come to be used as an exposure light source. In recent years, attempts to make pattern dimensions finer without changing an exposure light source have been made. One approach in the attempts is a phase shift method. The approach is such that a phase-inverted layer (phase shifter) is provided partially at a light transmission section to remove an adverse effect of diffraction occurring between adjacent patterns, thereby improving the pattern accuracy.

One phase-shift approach by which resolution is particularly improved is the Levenson-type phase shift method (Jpn. Pat. Appln. KOKAI Publication No. 62-50811). With this approach, phase shifters are provided alternately on the light transmission section in a mask on which a shading pattern is provided. The phase of the light passing through a phase shifter is inverted by 180° with respect to the light passing through a portion where a phase shifter is not provided. Inverting the phase of light at the adjacent transmission sections this way causes negative interference of light between the patterns, thereby improving the resolution.

One known method of manufacturing Levenson-type phase shift masks is the approach of making a mask by digging a substrate (Jpn. Pat. Appln. KOKAI Publication No. 62-189468). Masks using the approach of digging a substrate, however, have a problem: even if the dimensions of the opening are the same, the phase shift section where the substrate is dug differs from the non-phase shift section where the substrate is not dug in the intensity of light. The problem arises from the fact that the dimensions of the opening are optically narrowed by the interference of the pattern edge portion parallel to the optical axis at the phase shift section.

To solve the problem, the adjustment of the desired exposure has been made by adjusting the dimensions of openings in a pattern of a conventional exposure mask. Such adjustment by the dimensions of openings, however, is liable to be restricted by the pattern. For instance, the desired opening width cannot be obtained, depending on the size of adjacent patterns.

As described above, since the Levenson method-applied pattern differs from the Levenson method-unapplied pattern in the desired exposure in a conventional Levenson-type phase shift mask and the adjustment of the desired exposure is made by adjusting the dimensions of openings in a pattern, the pattern has imposed restriction on the adjustment. For instance, the desired opening width cannot be provided, depending on the size of adjacent patterns.

The object of the present invention is to provide an exposure mask capable of adjusting the desired exposure for Levenson method-applied patterns and Levenson method-unapplied patterns without being restricted by the patterns and a manufacturing method thereof.

SUMMARY OF THE INVENTION

The foregoing object is accomplished by providing an exposure mask comprising: a phase shift section including a plurality of opening patterns formed by making openings in part of a shading film provided on a transmissive substrate and digging part of the substrate; and a non-phase shift section including at least one opening pattern, wherein the opening pattern of the non-phase shift section has a dig whose amount of digging has been adjusted according to the amount of digging in the opening patterns of the phase shift section.

With the exposure mask, the adjustment of the image intensity is made by adjusting the amount of digging in the transmissive substrate, not by adjusting the opening width.

The phase shift section includes a plurality of openings with a minimum opening dimension of L and has a dig whose amount of digging has been adjusted so that the optical path difference for the light passing through an undigging region of the transmissive substrate may be almost $\lambda/2$ with respect to exposure light with a wavelength of $\lambda$, and the second opening pattern group has a dig whose amount of digging has been adjusted so that the optical path difference may be almost $\lambda$.

Alternatively, the phase shift section includes a plurality of openings with a minimum opening dimension of L, the plurality of openings constituting a first opening pattern group and a second opening pattern group arranged alternately at least in one direction, the first opening pattern group having a dig whose amount of digging has been adjusted so that the optical path difference for the light passing through an undigging region of the transmissive substrate may be $\lambda/2$ or less with respect to exposure light with a wavelength of $\lambda$ and which has been formed in a boundary portion with the shading film and below part of the shading film, and the second opening pattern group having a dig whose amount of digging has been adjusted so that the absolute value of the optical path difference may be almost $\lambda/2$ with respect to the first opening pattern group and which has been formed in a boundary portion with the shading film and below part of the shading film.

Still alternatively, the phase shift section includes a plurality of openings with a minimum opening dimension of L, the plurality of openings constituting a first opening pattern group and a second opening pattern group arranged alternately at least in one direction, the phase shift members being stacked so that the first opening pattern group may have an optical path difference of almost zero for the light passing through an unstacked region of phase shift members with respect to exposure light with a wavelength of $\lambda$, and the second opening pattern group may have an optical path difference of almost $\lambda/2$ with respect to the first opening pattern group.

In the non-phase shift section, at least one opening pattern group having not only the opening dimension larger than the minimum opening dimension of L but also the same optical path difference as those of opening patterns adjacent to each other along the longitudinal side, has a dig whose amount of digging has been adjusted so that a pattern formed on a specimen may be of almost the desired dimensions with respect to the exposure necessary for resolving a pattern with the minimum opening dimension of L.

The foregoing object is also accomplished by a method of manufacturing exposure masks, comprising: a first step of forming on a shading film formed on a transmissive substrate a first photosensitive resin film having a pattern of a first pattern data group containing all opening patterns to be formed as an exposure mask, selectively etching the shading film using the pattern of the photosensitive resin film as a mask, and then removing the remaining photosensitive resin film to form an opening pattern group; a second step of forming a second photosensitive resin film having a pattern of a second pattern data group obtained by extracting opening patterns whose optical path difference with respect to the light passing through an unprocessed region of the transmissive substrate is almost $\lambda$, etching the transmissive substrate using the pattern of the photosensitive resin film as a mask so as to have an optical path difference of almost $\lambda/2$ with respect to the light passing through an opening before processing, and then removing the remaining photosensitive resin film; and a third step of forming a third photosensitive resin film having a pattern of a third pattern data group obtained by extracting opening patterns whose optical path difference with respect to the light passing through an unprocessed region of the transmissive substrate is almost $\lambda/2$ and $\lambda$, etching the transmissive substrate using the pattern of the photosensitive resin film as a mask so that the optical path difference with respect to the light passing through an unprocessed opening region of the transmissive substrate may increase by almost $\lambda/2$, and then removing the remaining photosensitive resin film.

The foregoing object is further accomplished by providing a method of manufacturing exposure masks, comprising: a first step of forming on a shading film formed on a transmissive substrate a first photosensitive resin film having a pattern of a first pattern data group containing all opening patterns to be formed as an exposure mask, selectively etching the shading film using the pattern of the photosensitive resin film as a mask, and then removing the remaining photosensitive resin film to form an opening pattern group; a second step of forming a second photosensitive resin film having a pattern of a second pattern data group obtained by extracting opening patterns whose optical path difference with respect to the light passing through an unprocessed region of the transmissive substrate is almost $\lambda$, etching the transmissive substrate using the pattern of the photosensitive resin film as a mask so as to have an optical path difference of almost $\lambda$ with respect to the light passing through an opening before processing, and then removing the remaining photosensitive resin film; and a third step of forming a third photosensitive resin film having a pattern of a third pattern data group obtained by extracting opening patterns whose optical path difference with respect to the light passing through an unprocessed region of the transmissive substrate is almost $\lambda/2$, etching the transmissive substrate using the pattern of the photosensitive resin film as a mask so that the optical path difference with respect to the light passing through an opening before processing may increase by almost $\lambda/2$, and then removing the remaining photosensitive resin film.

The foregoing object is still further accomplished by providing a method of manufacturing exposure masks, comprising: a first step of forming on a shading film formed on a transmissive substrate a first photosensitive resin film having a pattern of a first pattern data group containing all opening patterns, selectively etching the shading film using the pattern of the photosensitive resin film as a mask, and then removing the remaining photosensitive resin film to form an opening pattern group; a second step of forming a second photosensitive resin film having a pattern of a second pattern data group obtained by extracting opening patterns whose optical path difference with respect to the light passing through all of the phase shift openings in the transmissive substrate and an unprocessed region of the transmissive substrate in a non-phase shift section is almost $\lambda$, etching the transmissive substrate using the pattern of the photosensitive resin film as a mask so as to have an optical path difference of almost $\lambda/2$ with respect to the light passing through an opening before processing, and then removing the remaining photosensitive resin film; and a third step of forming a third photosensitive resin film having a pattern of a third pattern data group obtained by extracting not only phase shift opening patterns whose optical path difference with respect to the light passing through an unprocessed region of the transmissive substrate is almost $\lambda$ but also opening patterns whose optical path difference with respect to the light passing through an unprocessed region of the transmissive substrate is almost $\lambda/2$ and $\lambda$, etching the transmissive substrate using the pattern of the photosensitive resin film as a mask so that the optical path difference with respect to the light passing through an unprocessed opening region of the transmissive substrate may increase by almost $\lambda/2$, and then removing the remaining photosensitive resin film.

In each of the above methods of manufacturing exposure masks, either the second step or the third step may be carried out earlier. In place of a dig in the substrate, phase shift members may be stacked to form the phase shift section. After the first step, a phase sift member may be coated on the transmissive substrate and thereafter the second and third steps be carried out. The pattern data used in those steps must be created as follows.

A first pattern data group containing all opening patterns, a second pattern data group obtained by extracting not only phase shift openings whose optical path difference with respect to the light passing through an unprocessed region of the transmissive substrate is almost zero but also opening patterns whose optical path difference with respect to the light passing through an unprocessed region of the transmissive substrate in a non-phase shift section is almost $\lambda/2$ or $\lambda$, and a third pattern data group obtained by extracting non-phase shift openings whose optical path difference with respect to the light passing through an unprocessed region of the transmissive substrate are created.

When the third pattern data group contains data on both of the optical path differences $\lambda/2$ and $\lambda$ with respect to the light passing through the unprocessed region of the transmissive substrate in the non-phase shift section, it is necessary to create a fourth pattern data obtained by dividing the third pattern data group. In this case, a fourth step obtained by replacing the third pattern data group with the fourth pattern data group in the third step is needed.

The present specification discloses a method of creating pattern data used in drawing or checking exposure masks according to the present invention. The method comprises the following steps (a) to (d):

(a) the step of creating a first pattern data group containing all opening patterns, a second pattern data group obtained by extracting opening patterns whose optical path difference with respect to the light passing through an unprocessed region of the transmissive substrate is almost $\lambda$, and a third pattern data group obtained by extracting opening patterns whose optical path difference with respect to the light passing through the unprocessed region of the transmissive substrate is almost $\lambda/2$ and $\lambda$.

(b) the step of creating a first pattern data group containing all opening patterns, a second pattern data group obtained by extracting opening patterns whose optical path difference with respect to the light passing through an unprocessed region of the transmissive substrate in all of the phase shift openings and non-phase shift section of the transmissive substrate is almost $\lambda$, and a third pattern data group obtained by extracting not only phase shift opening patterns whose optical path difference with respect to the light passing through the unprocessed region of the transmissive substrate is almost $\lambda$ but also opening patterns whose optical path difference with respect to the light passing through the unprocessed region of the transmissive substrate in the non-phase shift section is almost $\lambda/2$ and $\lambda$.

(c) the step of creating a first pattern data group containing all opening patterns, a second pattern data group obtained by extracting opening patterns whose optical path difference with respect to the light passing through an unprocessed region of the transmissive substrate is almost $\lambda$, and a third pattern data group obtained by extracting opening patterns whose optical path difference with respect to the light passing through the unprocessed region of the transmissive substrate is almost $\lambda/2$.

(d) the step of creating a first pattern data group containing all opening patterns, a second pattern data group obtained by extracting not only opening patterns whose optical path difference with respect to the light passing through an unprocessed region of the transmissive substrate is almost zero but also opening patterns formed by digging the transmissive substrate, and a third pattern data group obtained by extracting opening patterns formed by digging the transmissive substrate.

The above-described exposure mask and a manufacturing method thereof according to the present invention produce the following effect.

With a pattern obtained by digging a transmissive substrate, the image intensity is liable to attenuate when the exposure light passes through the substrate, because of the existence of the edge. This phenomenon is the main cause of being unable to obtain the desired pattern dimensions in a Levenson-type phase shift mask where one of adjacent openings is made by digging the substrate, because the light intensity attenuates at the dug portion. The adjustment of the light intensity at an opening was made by adjusting the opening width in the prior art. With this method, however, when there is another opening adjacent to the opening, the desired opening width cannot be obtained.

In the present invention, attention is given to the fact that the image intensity attenuates because of the existence of the edge. To adjust the light intensity, the amount of digging in a region to which the phase shift method is not applied, that is, in a pattern whose peripheral pattern has the same amount of digging, is adjusted. Accordingly, with the present invention, the image intensity can be adjusted without the limitation of patterns.

To attenuate the light intensity, it is desirable that adjustment should be made to form the following structures:

(1) a structure where the optical path difference is almost $\lambda/2$ with respect to an undigging portion of the transmissive substrate (2) a structure where the optical path difference is almost $\lambda$ with respect to an undigging portion of the transmissive substrate In the case of structure (1) and structure (2), even if an opening has the same width, the light intensity decreases in that order. The structure is determined so that the focal depth obtained after exposure may be maximized. This approach can be applied to cases where the Levenson section is has been formed so as to have a shifter digging structure (regardless of whether the edge of the shading section coincides with the etching portion of the transmissive substrate) or a shifter deposit structure.

Furthermore, in the case of the digging type where the Levenson section is formed so that the edge of the shading section may coincide with the etching portion of the transmissive substrate (e.g., Japanese Patent Application No. 6-43618), use of the following structure makes adjustment so that the light intensity may be amplified:

(3) a structure where the optical path difference is almost zero with respect to an undigging portion of the transmissive substrate.

By selecting structure (1) to structure (3) as needed, the adjustment of the light intensity (or optimum exposure energy) difference between the Levenson method-applied section and the Levenson method-unapplied section and the proper exposure can be made easily.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 4A to 4D are sectional views of masks formed so that the periodic end of the phase shift section may have an optical pass difference of $\lambda$ with respect to the light passing through the transmissive substrate;

FIG. 5 is a flowchart for creating mask data in connection with a first embodiment of the present invention;

FIGS. 10A and 10B show the relationship between the exposure latitude and the focal latitude obtained with the exposure mask produced through the steps of FIGS. 8A to 8H;

FIGS. 12A and 12B show the relationship between the exposure latitude and the focal latitude obtained with the exposure mask produced using the mask data of FIG. 11;

FIGS. 14A and 14B show the relationship between the exposure latitude and the focal latitude obtained with the exposure mask produced using the mask data of FIG. 11;

FIGS. 16A to 16F are sectional views of the second half of the steps of manufacturing phase-shift member deposit exposure masks according to the twelfth embodiment using the mask data created in FIG. 5;

FIGS. 17A to 17F are sectional views of the first half of the steps of manufacturing phase-shift member deposit exposure masks according to a thirteenth embodiment of the present invention using the mask data created in FIG. 5;

DETAILED DESCRIPTION OF THE PREFERRED EMBODIMENTS

Before explanation of embodiments of the present invention, a basic structure of an exposure mask according to the present invention will be described.

Figure 1:
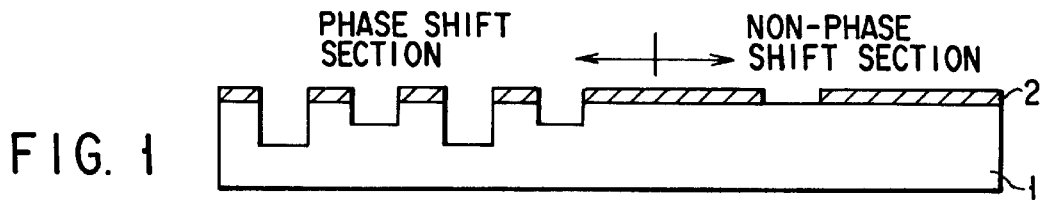
FIG. 1 shows a basic structure of an exposure mask according to the present invention and is a sectional view of an example having an isolated pattern having almost the same dimensions as those of a phase shift section, in a non-phase shift section.

FIG. 1 is a sectional view of a mask produced so that an isolated pattern having almost the same dimensions of those of a phase shift section, in a non-phase shift section may have a phase difference of zero degree with respect to the light passing through a transmissive substrate. On the transmissive substrate 1, a shading film 2 having openings in it is formed. In a phase shift section, the substrate 1 is dug at the openings in the shading film 2. The amount of digging in the substrate in the phase shift section is such that one of the adjacent digs has an optical path difference of $\lambda$ with respect to an undigging region and the other has an optical path difference of $\lambda/2$ with respect to the undigging region.

Figure 2A:
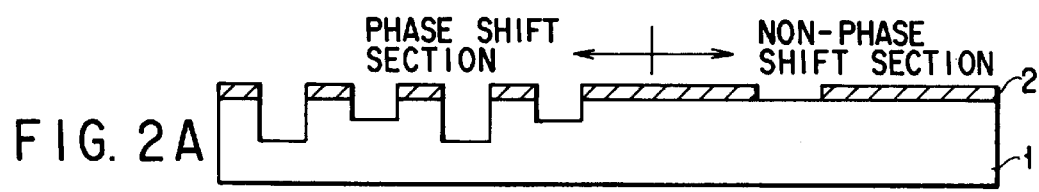
FIGS. 2A to 2C show basic structures of an exposure mask according to the present invention and are sectional views of examples of masks formed so that the periodic end of the phase shift section may have an optical pass difference of $\lambda/2$ with respect to the light passing through the transmissive substrate, said masks each having an isolated pattern whose dimensions are larger than those of a phase shift section, in a non-phase shift section.
Figure 2B:
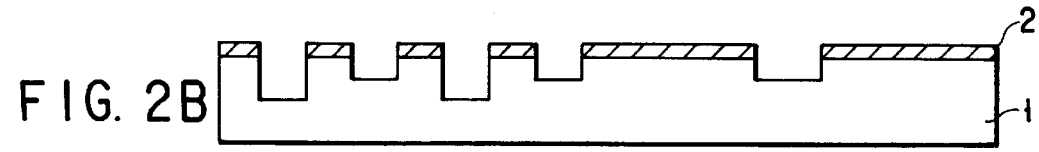
Figure 2C:
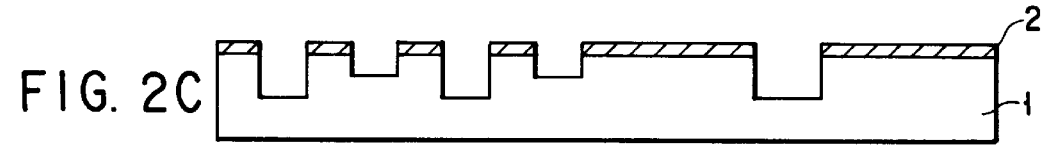

FIGS. 2A to 2C show cases where the opening in a non-phase shift section is made larger than that in a phase shift section. FIG. 2A is a sectional view of a mask produced so that the opening in the non-phase shift section may have an optical pass difference of 0 degree with respect to the light passing through the undigging region of the transmissive substrate, that is, a case where the substrate is not dug in the non-phase shift section; FIG. 2B is a sectional view of a mask produced so that the opening in the non-phase shift section may have a phase difference of $\lambda/2$ with respect to the light passing through the undigging region of the transmissive substrate, that is, a case where the substrate is dug $\lambda/2$ in the non-phase shift section; and FIG. 2C is a sectional view of a mask produced so that the opening in the non-phase shift section may have a phase difference of $\lambda$ with respect to the light passing through the undigging region of the transmissive substrate, that is, a case where the substrate is dug by $\lambda$ in the non-phase shift section.

Figure 3A:
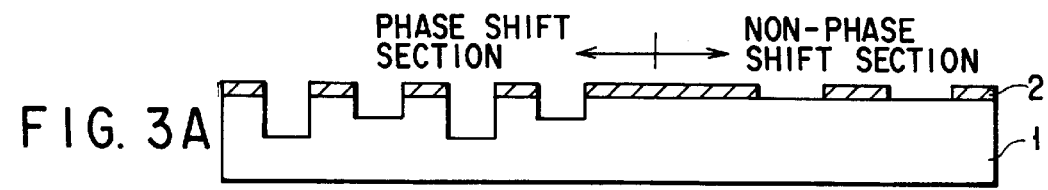
FIGS. 3A to 3C show basic structures of an exposure mask according to the present invention and are sectional views of examples each having a dense pattern whose dimensions are larger than those of a phase shift section, in a non-phase shift section, and whose adjacent periodic end of the phase shift have $\lambda/2$ of the optical pass difference with respect to an undigging portion of the transmissive substrate.
Figure 3B:
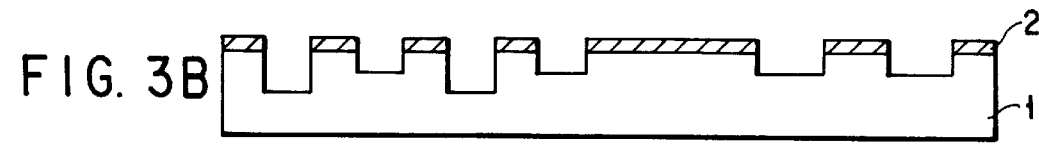
Figure 3C:
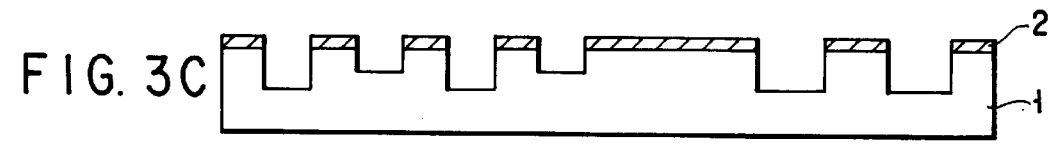

FIGS. 3A to 3C show cases where the openings in the non-phase shift section are a dense pattern whose dimensions are larger than those of the openings in the phase shift section. FIGS. 3A to 3C correspond to FIGS. 2A to 2C, respectively.

FIG. 4A is a sectional view of a mask formed so that the periodic end of the phase shift section of FIG. 1 may have an optical pass difference of $\lambda$ with respect to the light passing through the transmissive substrate; FIG. 4B is a sectional view of a mask formed so that the periodic end of the phase shift section of FIG. 2B may have an optical pass difference of $\lambda$ with respect to the light passing through the transmissive substrate; FIG. 4C is a sectional view of a mask formed so that the periodic end of the phase shift section of FIG. 3C may have an optical pass difference of $\lambda$ with respect to the light passing through the transmissive substrate; and FIG. 4D is a sectional view of a mask formed so that the periodic end of the phase shift section of FIG. 3A may have an optical pass difference of $\lambda$ with respect to the light passing through the transmissive substrate.

Hereinafter, embodiments of the present invention associated with the aforementioned various exposure masks will be described.

(First Embodiment)

A first embodiment of the present invention relates to a method of creating mask data used in the manufacture of exposure masks of FIG. 2A.

FIG. 5 is a sectional view of a portion of an exposure mask. In the figure, there are five openings: opening 501, opening 502, opening 503, opening 504, and opening 505 in that order from the left.

First, those openings were identified. In the identification, they were grouped by the desired optical path difference with respect to the exposure wavelength using the exposure light passing through the transmissive substrate as a reference. As a result, opening 501 and opening 503 were recognized as patterns having an optical path difference of $\lambda$, opening 502 and opening 504 were recognized as patterns having an optical path difference of $\lambda/2$, and opening 505 was recognized as a pattern having an optical path difference of 0.

Next, grouping was done as follows.

First, in the step of extracting data on all of the openings, data on all of the openings 501 to 505 was extracted and classified as a first pattern data group. Then, in the step of extracting data on the openings with an optical path difference of $\lambda$, data on the openings 501 and 503 was extracted and classified as a second pattern data group. Then, in the step of extracting data on the openings with optical path differences of $\lambda/2$ and $\lambda$, data on the openings 501 to 504 was extracted and classified as a third pattern data group.

The first pattern data group has the data of almost the same values as the mask processing dimensions. The second pattern data group and third pattern data group are adjusted so that they may be equal to the mask processing dimensions when no shading film exists at the pattern boundary, and be larger than the mask processing dimensions when a shading film exists at the pattern boundary. The amount of adjustment may take any value as long as it is within the width in which the shading film exists, and is preferably larger than the alignment accuracy value of the drawing device. In a case where openings alternate with shading sections periodically, the amount of adjustment should be about half the shading film width.

(Second Embodiment)

A second embodiment of the present invention relates to a method of manufacturing exposure masks of FIG. 2A for use in exposure by an KrF Excimer laser (with a wavelength of 248 nm), using the pattern data groups created in the first embodiment. The second embodiment is related to a method of manufacturing exposure masks according to claim 4.

Figure 6A:
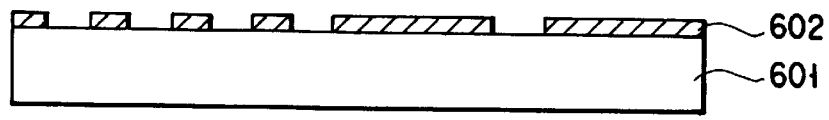
FIGS. 6A to 6H are sectional views of the steps of manufacturing exposure masks in connection with a second embodiment of the present invention using the mask data created in FIG. 5.

FIGS. 6A to 6H are sectional views of the steps of manufacturing exposure masks in connection with the second embodiment. First, a mask blank covered with a shading film composed of a CrON film 602 was provided on one surface of a transmissive substrate 601 made of quartz. On the shading film 602 of the mask blank, a resin film sensitive to electron beam was formed. An image was drawn on the resin film by an electron beam using the first pattern data group created in the first embodiment and then was developed. Then, the exposed CrON film 602 was etched away by cerium nitrate secondary ammonium solution. Thereafter, the photosensitive resin film was removed to form a shading film pattern (FIG. 6A).

Figure 6B:
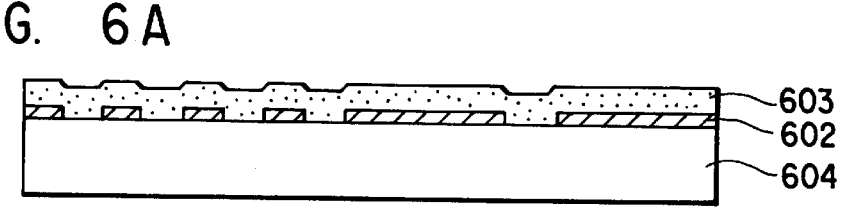
Figure 6C:
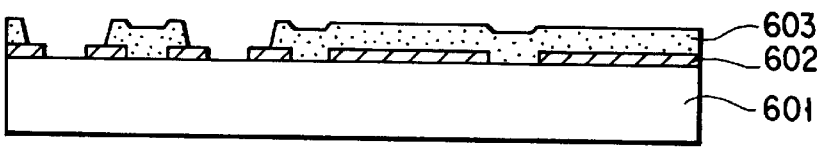

Then, a resin film 603 sensitive to ultraviolet rays was formed on the substrate having the shading pattern (FIG. 6B). An image was drawn on the resin film 603 by an ultraviolet beam using the second pattern data group created in the first embodiment and then was developed to form a resist pattern. The second pattern data group was made greater up to approximately half the shading film width, when the shading film 602 adjoined an opening (FIG. 6C).

Figure 6D:
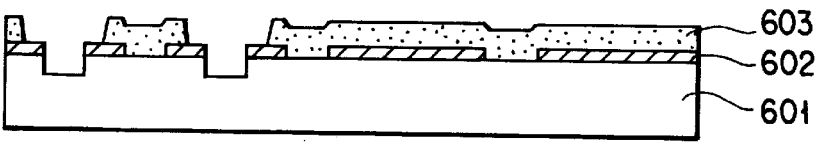

With the resist pattern as a mask, the transmissive substrate 601 was etched about 248 nm in depth by $CF_4$ gas (FIG. 6D). The amount of etching caused an optical path difference of $\lambda/2$ with respect to the exposure wavelength at the unetching surface with a refractive index of 1.5 at a depth of 248 nm of the transmissive substrate 601.

Figure 6E:
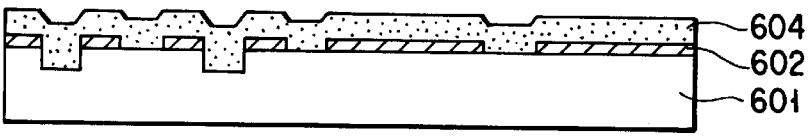

Next, the photosensitive resin film 603 was removed and a new photosensitive resin film 604 was formed on the pattern surface (FIG. 6E). An image was drawn on the resin film 604 by an ultraviolet beam using the third pattern data group created in the first embodiment and then was developed to form a resist pattern. The third pattern data group was made greater up to approximately half the shading film width, when the shading film 602 adjoined an opening (FIG. 6F).

Figure 6F:
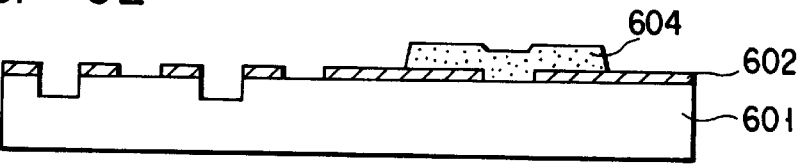
Figure 6G:
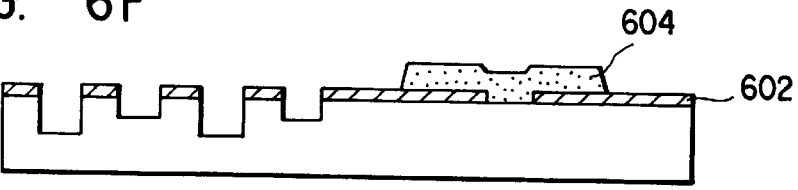
Figure 6H:
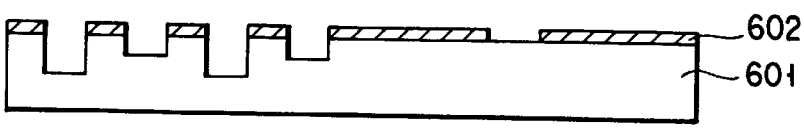

With the resist pattern as a mask, the transmissive substrate 601 was etched only about d=248 nm in depth by $CF_4$ gas (FIG. 6G). The amount of etching caused an optical path difference of $\lambda/2$ with respect to the exposure wavelength at the unetching surface with a refractive index of 1.5 at a depth of 248 nm of the transmissive substrate 601. Thereafter, the photosensitive resin film 604 was removed to form a desired exposure mask (FIG. 6H).

In the second embodiment, after the state shown in FIG. 6D, an image may be drawn using the third pattern data group without removing the photosensitive resin film 603 and be developed to form a resist pattern as in FIG. 6F. With the resist pattern as a mask, the transmissive substrate 601 may be etched about 248 nm in depth by $CF_4$ gas and thereafter, the photosensitive resin film 603 may be removed to form a desired exposure mask (FIG. 6H).

Although the second embodiment relates to a method of manufacturing KrF Excimer laser exposure masks, the present invention is not limited to this. For instance, the invention may be applied to exposure masks used for I rays of the mercury lamp (365 nm), ArF Excimer laser (193 nm), or XeHg lamps (248 to 250 nm). In this case, the amount of etching (d) must be varied according to an exposure wavelength of $\lambda$ and a refractive index of n of the transmissive substrate at the exposure wavelength.

At that time, the amount of etching (d) should be determined by the following equation:

$$d=\lambda/(2(n-1))$$

By setting the amount of etching corresponding to an optical path difference of $\lambda$ at a value a little smaller than 2d, the exposure characteristic can be improved. It is desirable that if the final amount of etching is D and the second amount of etching of the transmissive substrate is d2, the first amount of etching (d1) of the transmissive substrate should fulfill the following expression:

$$d1>D-d2$$

The reason is that in the second etching, the etchent supply rate drops at the portion where a groove has been formed, which makes the etching speed slower, preventing the substrate from being etched up to d2. Therefore, the desired value may not be achieved. In contrast, by setting d1 as described above, the amount of etching can be controlled optimally.

While in the second embodiment, quartz was used for the transmissive substrate, the present invention is not limited to this. For instance, $Si_3N_4$, $Al_2O_3$, $CaF_2$, or $HfO_2$ may be used in place of quartz. At that time, gas used in etching the transmissive substrate should be selected according to the material of the transmissive substrate.

Although a film containing CrON was used as a shading material, the invention is not restricted to this. For instance, a film containing MoSi or Si may be used.

In drawing for the formation of a mask pattern, an electron beam or an ultraviolet-light beam may be used as needed. When an electron beam is used after the formation of a shading pattern, however, it is desirable that exposure should be carried out after a conductive film has been formed on the top or bottom of the photosensitive resin film.

(Third Embodiment)

A third embodiment of the present invention relates to the exposure mask formed in the second embodiment. Exposure was carried out using a KrF Excimer laser as a light source under the conditions of NA=0.5 and σ=0.3.

As for the patterns on the mask, a Levenson method-applied region (a phase shift section) had a 0.18 μm line and space (L & S) pattern and a Levenson method-unapplied region (a non-phase shift section) had a 0.20 μm isolated space pattern.

A resist sensitive to a KrF Excimer laser was formed to a film thickness of 0.5 μm on a processed substrate. The processed substrate was such that the unevenness of the substrate resulting from interconnections had been flattened and then a film for decreasing the reflection of exposure light was provided on the smooth substrate.

Figure 9A:
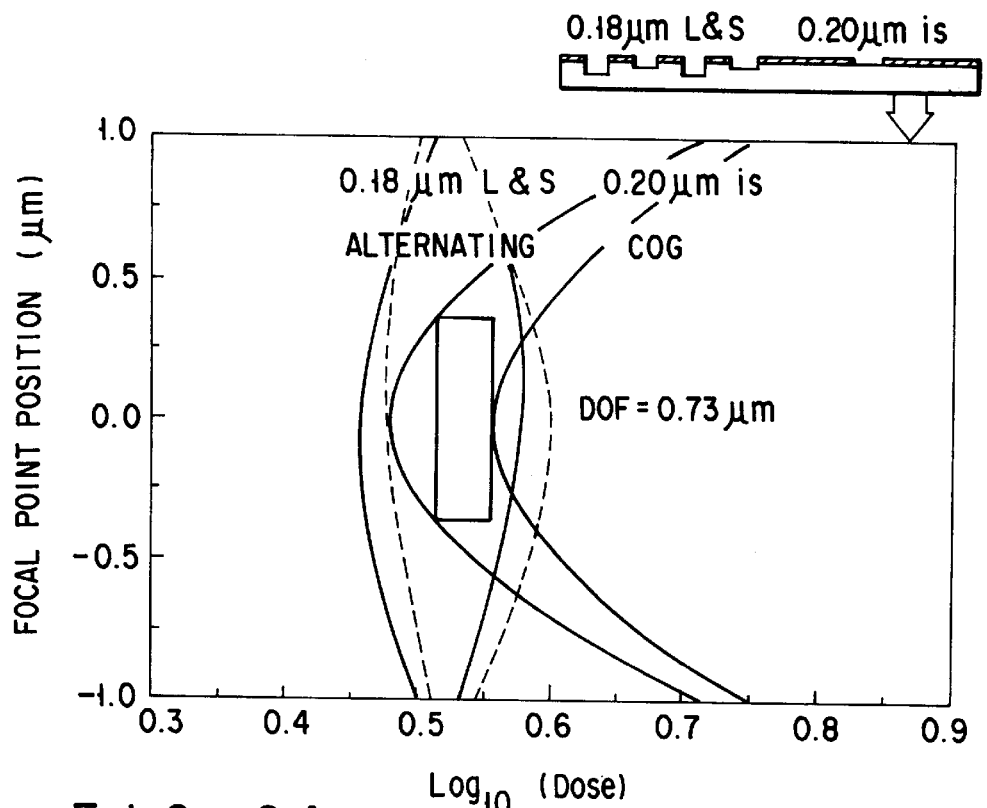
FIGS. 9A and 9B show the relationship between the exposure latitude and the focal latitude obtained with the exposure mask produced through the steps of FIGS. 6A to 6H.
Figure 9B:
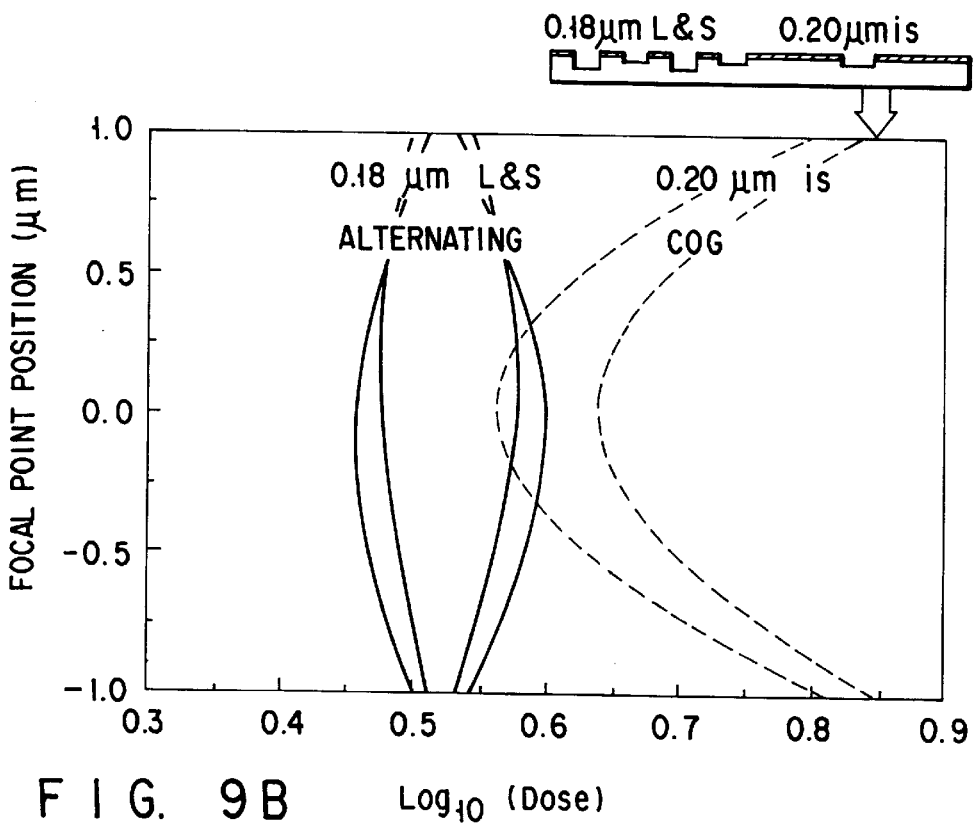

FIG. 9A shows the focal depth in a case where the Levenson method-unapplied portion has the structure of FIG. 2A. The exposure conditions were as follows: NA=0.5, σ=0.3, the Levenson method-applied pattern=a 0.18 μm L & S pattern, and the Levenson method-unapplied pattern=a 0.20 μm isolated space pattern). In FIGS. 9A and 9B, the focal depth is represented by a square, the logarithm of exposure is plotted on the abscissa axis, and the defocus position is plotted on the ordinate axis. The focal depth was determined, provided that allowable fluctuations in the exposure are up to 10% and fluctuations in the dimensions at that time are±10% with respect to the desired values. The area enclosed by the square is the allowable range. The focal depth computed under those conditions was 0.73 μm as shown in FIG. 9A.

On the other hand, in a case where a mask having a similar pattern was formed so as to have the structure of FIG. 2B, any focal depth was not obtained at all as shown in FIG. 9B.

It was found that the pattern structure used in the third embodiment achieved a great focal depth when the non-Levenson region was formed so as to have an optical path difference of 0 with respect to the light passing through the transmissive substrate.

As shown in the third embodiment, when a region with (the opening portion:the shading portion)=1:3 or more exists in the non-Levenson region having the opening dimensions almost the same as those of the Levenson region, it is desirable that the region should be formed so as to have an optical path difference of 0 with respect to the light passing through the transmissive substrate. The same holds true for a case where the region does not depend on the exposure wavelength and its standardized dimensions are almost the same.

When the processed shape of the outermost portion of a periodic pattern constructed using the minimum dimensions to produce the phase shift effect in the third embodiment was set so as to have a relative phase difference of λ with respect to the exposure light passing through the unetching portion of the transmissive substrate as shown in FIG. 4A, the image intensity was low at that portion and the rate was determined at that portion, thus achieving only a focal depth of 0.5 μm or less. In contrast, by setting the processed shape of the shallow portion of the periodic pattern to which the Levenson method has been applied so as to have a relative phase difference of λ/2 with respect to the exposure light passing through the unetching portion of the transmissive substrate, a focal depth of 0.73 μm was obtained.

As seen from the description of the third embodiment, the relative phase difference of the peripheral portion of the periodic pattern with respect to the exposure light passing through the unetching portion of the transmissive substrate must be adjusted by the desired focal depth. When there is room for the dimensions, the relative phase difference may be either λ or λ/2. To achieve a greater focal depth, the relative phase difference is preferably λ/2.

(Fourth Embodiment)

A fourth embodiment of the present invention relates to another method of creating mask data used in the manufacture of exposure masks of FIG. 2A.

Figure 7:
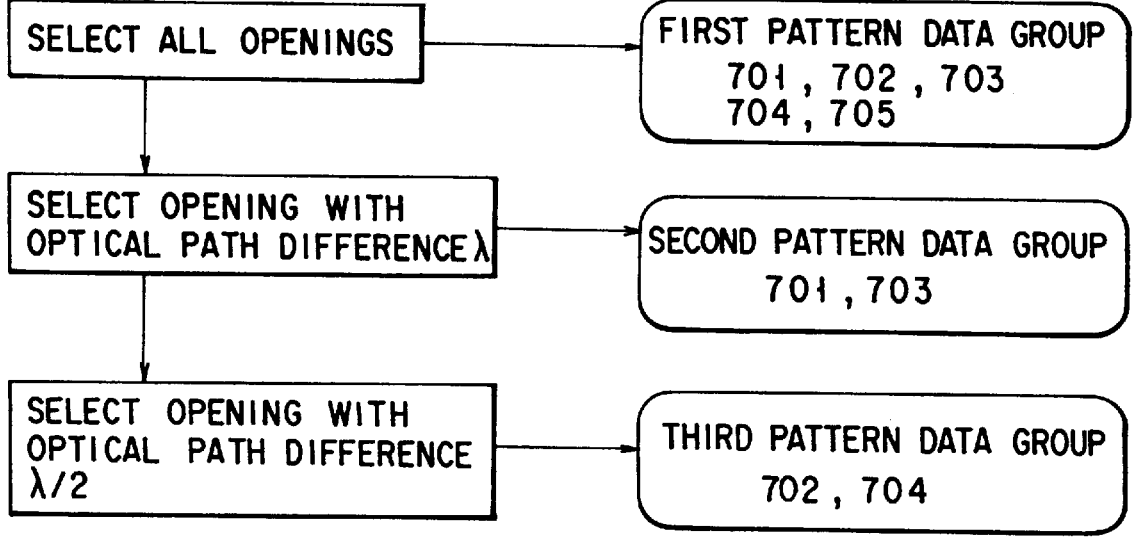
FIG. 7 is a flowchart for creating mask data in connection with a third embodiment of the present invention.

FIG. 7 is a sectional view of a portion of an exposure mask. In the figure, there are five openings: opening 701, opening 702, opening 703, opening 704, and opening 705 in that order from the left.

First, those openings were identified. In the identification, they were grouped by the desired optical path difference with respect to the exposure wavelength using the exposure light passing through the transmissive substrate as a reference. As a result, opening 701 and opening 703 were recognized as patterns having an optical path difference of λ, opening 702 and opening 704 were recognized as patterns having an optical path difference of λ/2, and opening 705 was recognized as a pattern having an optical path difference of 0.

Next, grouping was done as follows.

First, in the step of extracting data on all of the openings, data on all of the openings 701 to 705 was extracted and classified as a first pattern data group. Then, in the step of extracting data on the openings with an optical path difference of λ, data on the openings 701 and 703 was extracted and classified as a second pattern data group. Then, in the step of extracting data on the openings with an optical path difference of λ/2, data on the openings 702 and 704 was extracted and classified as a third pattern data group.

The first pattern data group has the data of almost the same values as the mask processing dimensions. The second pattern data group and third pattern data group are adjusted so that they may be equal to the mask processing dimensions when no shading film exists at the pattern boundary or be larger than the mask processing dimensions when a shading film exists at the pattern boundary. The amount of adjustment may take any value as long as it is within the width in which the shading film exists. It is desirable that the adjustment amount should be larger than the alignment accuracy value of the drawing device. In a case where openings alternate with shading sections periodically, the amount of adjustment should be about half the shading film width.

(Fifth Embodiment)

A fifth embodiment of the present invention relates to a method of manufacturing exposure masks of FIG. 2A for use in exposure by an KrF Excimer laser (with a wavelength of 248 nm), using the pattern data groups created in the fourth embodiment. The fifth embodiment is related to a method of manufacturing exposure masks according to claim 5.

Figure 8A:
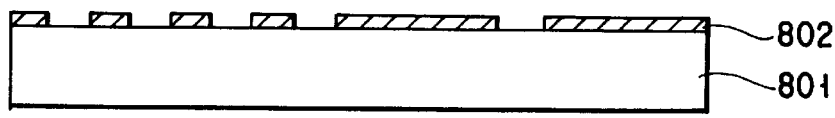
FIGS. 8A to 8H are sectional views of the steps of manufacturing exposure masks in connection with a fourth embodiment of the present invention using the mask data created in FIG. 7.

FIGS. 8A to 8H are sectional views of the steps of manufacturing exposure masks in connection with the fifth embodiment. First, a mask blank covered with a shading film composed of a MoSiON film 802 was provided on one surface of a transmissive substrate 801 made of quartz. On the shading film 802 of the mask blank, a resin film sensitive to electron beam was formed. An image was drawn on the resin film by an electron beam using the first pattern data group created in the fourth embodiment and then was developed. Then, the exposed MoSiON film was etched away by $CF_4+O_2$ gas. Thereafter, the photosensitive resin film was removed to form a shading film pattern (FIG. 8A).

Figure 8B:
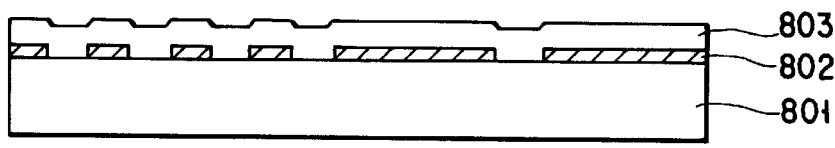
Figure 8C:
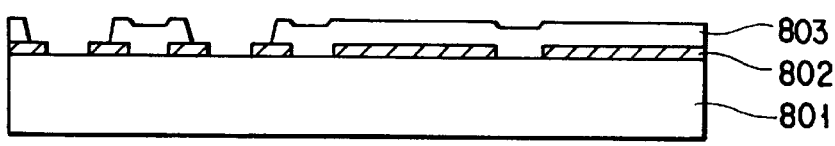

Then, a resin film 803 sensitive to ultraviolet rays was formed on the substrate having the shading pattern (FIG. 8B). An image was drawn on the resin film 803 by an ultraviolet beam using the second pattern data group created in the fourth embodiment and then was developed to form a resist pattern. The second pattern data group was made greater up to half the shading film width, when the shading film 802 adjoined an opening (FIG. 8C).

Figure 8D:
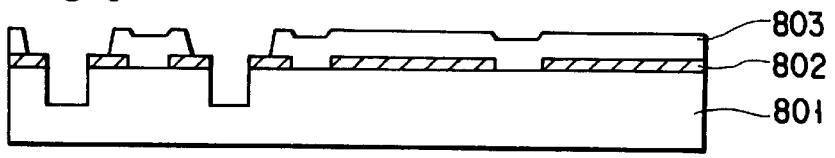

With the resist pattern as a mask, the transmissive substrate 801 was etched about D=248 nm in depth by $CF_4$ gas (FIG. 8D). The amount of etching caused an optical path difference of λ with respect to the exposure wavelength at the unetching surface with a refractive index of 1.5 at a depth of 248 nm in the transmissive substrate 801.

Figure 8E:
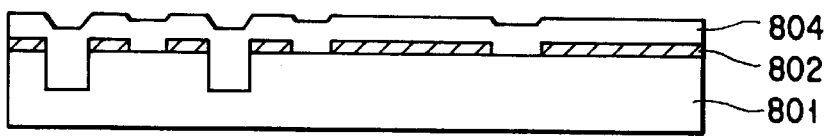
Figure 8F:
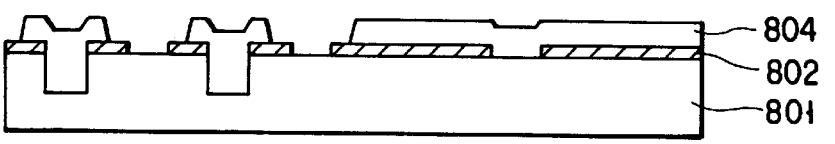

Next, the photosensitive resin film 803 was removed and a new photosensitive resin film 804 was formed on the pattern surface (FIG. 8E). An image was drawn on the resin film 804 by an ultraviolet beam using the third pattern data group created in the fourth embodiment and then was developed to form a resist pattern. The third pattern data group was made greater up to half the shading film width, when the shading film 804 adjoined an opening (FIG. 8F).

Figure 8G:
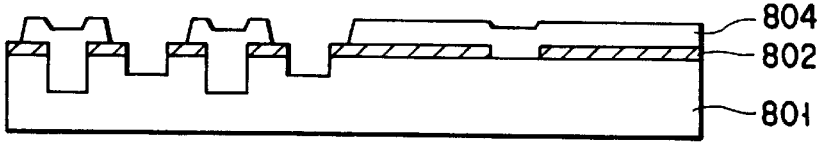
Figure 8H:

With the resist pattern as a mask, the transmissive substrate 601 was etched about d=248 nm in depth by $CF_4$ gas (FIG. 8G). The amount of etching caused an optical path difference of $\lambda/2$ with respect to the exposure wavelength at the unetching surface with at a refractive index of 1.5 at a depth of 248 nm in the transmissive substrate 801. Thereafter, the photosensitive resin film 804 was removed to form a desired exposure mask (FIG. 8H).

Although the fifth embodiment relates to a method of manufacturing KrF Excimer laser exposure masks, the present invention is not limited to this. For instance, the invention may be applied to exposure masks used for I rays of the mercury lamp (365 nm), ArF Excimer laser (193 nm), or XeHg lamps (248 to 250 nm).

In this case, the amount of etching (d) must be varied according to an exposure wavelength of $\lambda$ and a refractive index of n of the transmissive substrate at the exposure wavelength.

At that time, the amount of etching (d) should be determined by the following equation:

$$d=\lambda/(2(n-1))$$

By setting the amount of etching corresponding to an optical path difference of $\lambda$ at a value a little smaller than 2d as shown in the fifth embodiment, the exposure characteristic can be improved.

While in the fifth embodiment, quartz was used for the transmissive substrate, the present invention is not limited to this. For instance, $Si_3N_4$, $Al_2O_3$, $CaF_2$, $MgF_2$, or $HfO_2$ may be used in place of quartz. At that time, gas used in etching the transmissive substrate should be selected according to the material of the transmissive substrate.

Although a film containing MoSiON was used as a shading material, the invention is not restricted to this. For instance, a film containing Cr or Si may be used.

In drawing for the formation of a mask pattern, an electron beam or an ultraviolet-light beam may be used as needed. When an electron beam is used after the formation of a shading pattern, however, it is desirable that exposure should be carried out after a conductive film has been formed on the top or bottom of the photosensitive resin film.

(Sixth Embodiment)

A sixth embodiment of the present invention relates to the exposure mask formed in the fifth embodiment. Exposure was carried out using a KrF Excimer laser as a light source under the conditions of NA=0.5 and σ=0.5. As for the patterns on the mask, the Levenson method-applied region had a 0.18 μL & S pattern and the Levenson method-unapplied region had a pattern where 0.25 μm paces alternate with 0.50 μm lines.

A resist sensitive to a KrF Excimer laser was formed to a film thickness of 0.5 μm on a processed substrate. The processed substrate was such that the unevenness of the substrate resulting from interconnections had been flattened and then a film for decreasing the reflection of exposure light was provided on the smooth substrate.

FIG. 10A shows the focal depth in a case where the Levenson method-unapplied portion has the structure of FIG. 2A. The exposure conditions were as follows: NA=0.5, σ=0.3, the Levenson method-applied pattern=a 0.18 μm L & S pattern, and the Levenson method-unapplied pattern=a 0.25 μm space and 0.50 μm line pattern). In FIGS. 10A and 10B, the focal depth is represented by a square, the logarithm of exposure is plotted on the abscissa axis, and the defocus position is plotted on the ordinate axis. The focal depth was determined, provided that allowable fluctuations in the exposure are up to 10% and fluctuations in the dimensions at that time are ±10% with respect to the desired values. The area enclosed by the square is the allowable range. The focal depth computed under those conditions was 1.20 μm as shown in FIG. 10A.

On the other hand, in a case where a mask having a similar pattern was formed so as to have the structure of FIG. 2B, a focal depth was 1.05 μm as shown in FIG. 10B.

It was found that the pattern structure used in the sixth embodiment achieved a greater focal depth when the non-Levenson region was formed so as to have an optical path difference of $\lambda/2$ with respect to the light passing through the transmissive substrate.

As shown in the fifth embodiment, when a region with (the opening portion:the shading portion)=about 1:2 exists in the non-Levenson region having the opening dimensions 1.5 times as large as those of the Levenson region, it is desirable that the region should be formed so as to have an optical path difference of $\lambda/2$ with respect to the light passing through the transmissive substrate. The same holds true for a case where the region does not depend on the exposure wavelength and its standardized dimensions are almost the same.

(Seventh Embodiment)

A seventh embodiment of the present invention relates to a method of creating mask data used in the manufacture of exposure masks of FIG. 3B.

Figure 11:
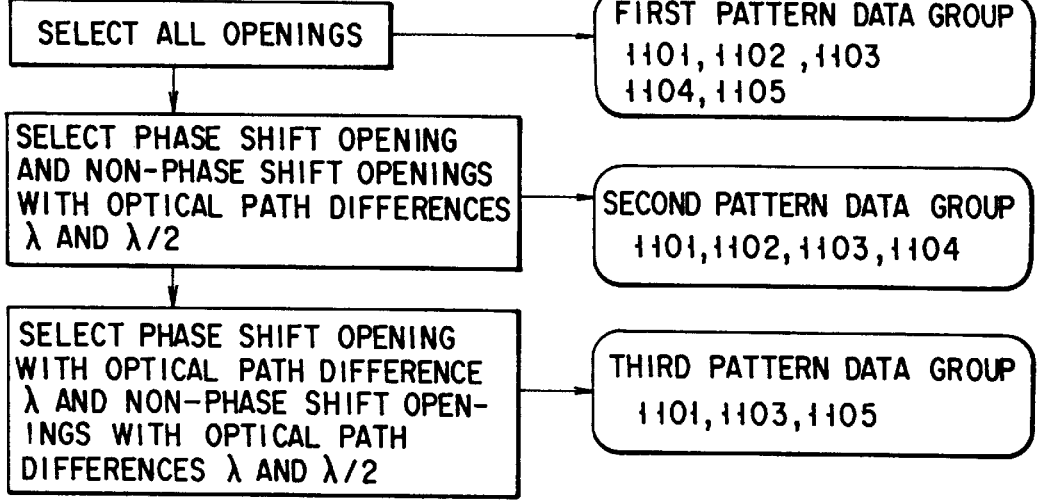
FIG. 11 is a flowchart for creating mask data in connection with a seventh embodiment of the present invention.

FIG. 11 is a sectional view of a portion of an exposure mask. In the figure, there are five openings: opening 1101, opening 1102, opening 1103, opening 1104, and opening 1105 in that order from the left.

First, those openings were identified. In the identification, they were grouped by the desired optical path difference with respect to the exposure wavelength using the exposure light passing through the transmissive substrate as a reference. As a result, opening 1101 and opening 1103 were recognized as patterns having an optical path difference of $\lambda$, opening 1102 and opening 1104 were recognized as patterns having an optical path difference of $\lambda/2$, and opening 1105 was recognized as a pattern having an optical path difference of about $\lambda/2$ (formed by the difference in the amount of dig between opening 1101 and opening 1102).

Next, grouping was done as follows.

First, in the step of extracting data on all of the openings, data on all of the openings 1101 to 1105 was extracted and classified as a first pattern data group. Then, in the step of extracting data on the openings with an optical path difference of $\lambda$ in the phase shift section and non-phase shift section, data on the openings 1101 to 1104 was extracted and classified as a second pattern data group. Then, in the step of extracting data on the openings with an optical path differences of $\lambda/2$ and $\lambda$ to the exposure light passing through not only the portion having an optical path difference of $\lambda$ with respect to the exposure light passing through the unprocessed portion of the transmissive substrate in the phase shift section but also the unprocessed portion of the transmissive substrate in the non-phase shift section, data on the openings 1101, 1102 and 1105 was extracted and classified as a third pattern data group.

The first pattern data group has the data of almost the same values as the mask processing dimensions. The second pattern data group and third pattern data group are adjusted so that they may be equal to the mask processing dimensions when no shading film exists at the pattern boundary or be larger than the mask processing dimensions when a shading film exists at the pattern boundary. The amount of adjustment may take any value as long as it is within the width in which the shading film exists. It is desirable that the adjustment amount should be larger than the alignment accuracy value of the drawing device. In a case where openings alternate with shading sections periodically, the amount of adjustment should be about half the shading film width.

(Eighth Embodiment)

An eighth embodiment of the present invention relates to a method of manufacturing exposure masks of FIG. 3B for use in exposure by an KrF Excimer laser (with a wavelength of 248 nm), using the pattern data groups created in the seventh embodiment.

A mask blank covered with a shading film composed of a MoSiON film was provided on one surface of a transmissive substrate made of quartz. On the shading film of the mask blank, a resin film sensitive to electron beam was formed. An image was drawn on the resin film by an electron beam using the first pattern data group created in the seventh embodiment and then was developed. Then, the exposed MoSiON film was etched away by $CF_4+O_2$ gas. Thereafter, the photosensitive resin film was removed to form a shading film pattern.

Then, a resin film sensitive to ultraviolet rays was formed on the substrate having the shading pattern. Thereafter, an image was drawn on the resin film by an ultraviolet beam using the second pattern data group created in the seventh embodiment and then was developed to form a resist pattern. The second pattern data group was made greater up to half the shading film width, when the shading film adjoined an opening.

With the resist pattern as a mask, the transmissive substrate was etched about d=248 nm in depth by $CF_4$ gas at opening 1101 to opening 1104. The amount of etching caused an optical path difference of $\lambda/2$ with respect to the exposure wavelength at the unetching surface with at a refractive index of 1.5 at a depth of 248 nm in the transmissive substrate.

Next, the photosensitive resin film 803 was removed and a new photosensitive resin film was formed on the pattern surface. An image was drawn on the resin film by an ultraviolet beam using the third pattern data group created in the seventh embodiment and then was developed to form a resist pattern. The third pattern data group was made greater up to half the shading film width, when the shading film adjoined an opening.

With the resist pattern as a mask, the transmissive substrate was etched about d=245 nm in depth by $CF_4$ gas at opening 1101, opening 1103, and opening 1105. The amount of etching caused an optical path difference of $\lambda/2$ with respect to the exposure wavelength at the unetching surface with a refractive index of 1.5 at a depth of 248 nm in the transmissive substrate. Thereafter, the photosensitive resin film was removed to form a desired exposure mask.

Although the eighth embodiment relates to a method of manufacturing KrF Excimer laser exposure masks, the present invention is not limited to this. For instance, the invention may be applied to exposure masks used for I rays of the mercury lamp (365 nm), ArF Excimer laser (193 nm), or XeHg lamps (248 to 250 nm). In this case, the amount of etching (d) must be varied according to an exposure wavelength of $\lambda$ and a refractive index of n of the transmissive substrate at the exposure wavelength.

At that time, the amount of etching (d) should be determined by the following equation:

$$d=\lambda/(2(n-1))$$

It is preferable to set the amount of etching 3 to 5% larger than the value of the right-hand side of the equation.

While in the eighth embodiment, quartz was used for the transmissive substrate, the present invention is not limited to this. For instance, $Si_3N_4$, $Al_2O_3$, $CaF_2$, $MgF_2$, or $HfO_2$ may be used in place of quartz. At that time, gas used in etching the transmissive substrate should be selected according to the material of the transmissive substrate.

Although a film containing MoSiON was used as a shading material, the invention is not restricted to this. For instance, a film containing Cr or Si may be used.

In drawing for the formation of a mask pattern, an electron beam or an ultraviolet-light beam may be used as needed. When an electron beam is used after the formation of a shading pattern, however, it is desirable that exposure should be carried out after a conductive film has been formed on the top or bottom of the photosensitive resin film.

(Ninth Embodiment)

A ninth embodiment of the present invention relates to the exposure mask formed in the eighth embodiment. Exposure was carried out using a KrF Excimer laser as a light source under the conditions of NA=0.5 and $\sigma$=0.3. As for the patterns on the mask, the Levenson method-applied region had a 0.18 $\mu$m L & S pattern and the Levenson method-unapplied region had a pattern where 0.25 $\mu$m spaces alternate with 0.50 $\mu$m lines.

A resist sensitive to a KrF Excimer laser was formed to a film thickness of 0.5 $\mu$m on a processed substrate. The processed substrate was such that the unevenness of the substrate resulting from interconnections had been flattened and then a film for decreasing the reflection of exposure light was provided on the smooth substrate.

FIG. 12A shows the focal depth in a case where the Levenson method-unapplied portion has the structure of FIG. 3A. In FIGS. 12A and 12B, the focal depth is represented by a square, the logarithm of exposure is plotted on the abscissa axis, and the defocus position is plotted on the ordinate axis. The focal depth was determined, provided that allowable fluctuations in the exposure are up to 10% and fluctuations in the dimensions at that time are ±10% with respect to the desired values. The area enclosed by the square is the allowable range. The focal depth computed under those conditions was 0.49 $\mu$m as shown in FIG. 12A.

On the other hand, in a case where a mask having a similar pattern was formed so as to have the structure of FIG. 3B, a focal depth was 0.93 $\mu$m as shown in FIG. 12B.

It was found that the pattern structure used in the ninth embodiment achieved a greater focal depth when the non-Levenson region was formed so as to have an optical path difference of $\lambda/2$ with respect to the light passing through the transmissive substrate.

As shown in the ninth embodiment, when a region with (the opening portion:the shading portion)=about 1:1 exists in the non-Levenson region having the opening dimensions 1.5 times as large as those of the Levenson region, it is desirable that the region should be formed so as to have an optical path difference of λ/2 with respect to the light passing through the transmissive substrate. The same holds true for a case where the region does not depend on the exposure wavelength and its standardized dimensions are almost the same.

(Tenth Embodiment)

A tenth embodiment of the present invention relates to exposure masks manufactured by the same method as in the eighth embodiment. The exposure masks correspond to FIG. 2B. Exposure was carried out using a KrF Excimer laser as a light source under the conditions of NA=0.5 and σ=0.5. The exposure mask produced in the tenth embodiment was compared in exposure transfer characteristic with an exposure mask that was formed by the same method as in the second embodiment and corresponded to FIG. 2A.

As for the patterns on the mask, the Levenson method-applied region had a 0.18 μm L & S pattern and the Levenson method-unapplied region had a 0.50 μm line and 0.25 μm space pattern.

A resist sensitive to a KrF Excimer laser was formed to a film thickness of 0.5 μm on a processed substrate. The processed substrate was such that the unevenness of the substrate resulting from interconnections had been flattened and then a film for decreasing the reflection of exposure light was provided on the smooth substrate.

Figure 13A:
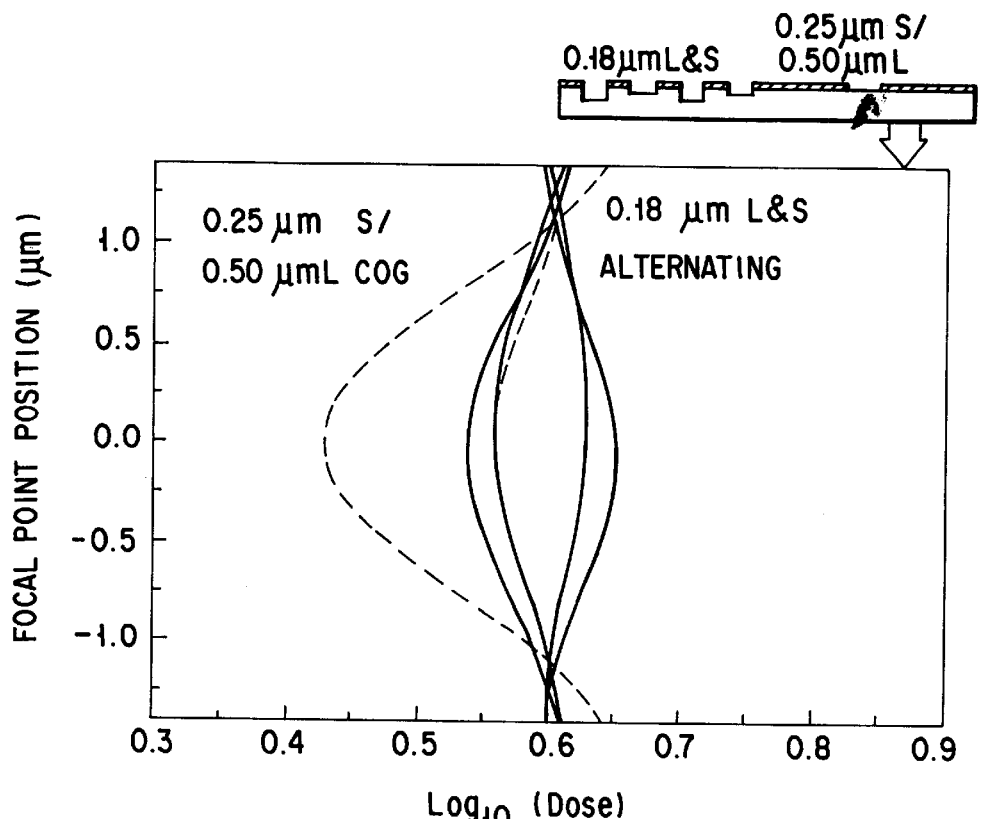
FIGS. 13A and 13B show the relationship between the exposure latitude and the focal latitude obtained with the exposure mask produced using the mask data of FIG. 11.

FIG. 13A shows the focal depth in a case where the Levenson method-unapplied portion has the structure of FIG. 2A. The exposure conditions were as follows: NA=0.5, σ=0.5, the Levenson method-applied pattern=a 0.18 μm space & line pattern, and the Levenson method-unapplied pattern=a 0.25 μm space and 0.50 μm line pattern). In FIG. 13, the focal depth is represented by a square, the logarithm of exposure is plotted on the abscissa axis, and the defocus position is plotted on the ordinate axis. The focal depth was determined, provided that allowable fluctuations in the exposure are up to 10% and fluctuations in the dimensions at that time are ±10% with respect to the desired values. The area enclosed by the square is the allowable range. As seen from FIG. 13A, any focal depth was not obtained at all in a case where the mask was formed so as to have the structure of FIG. 2A.

Figure 13B:
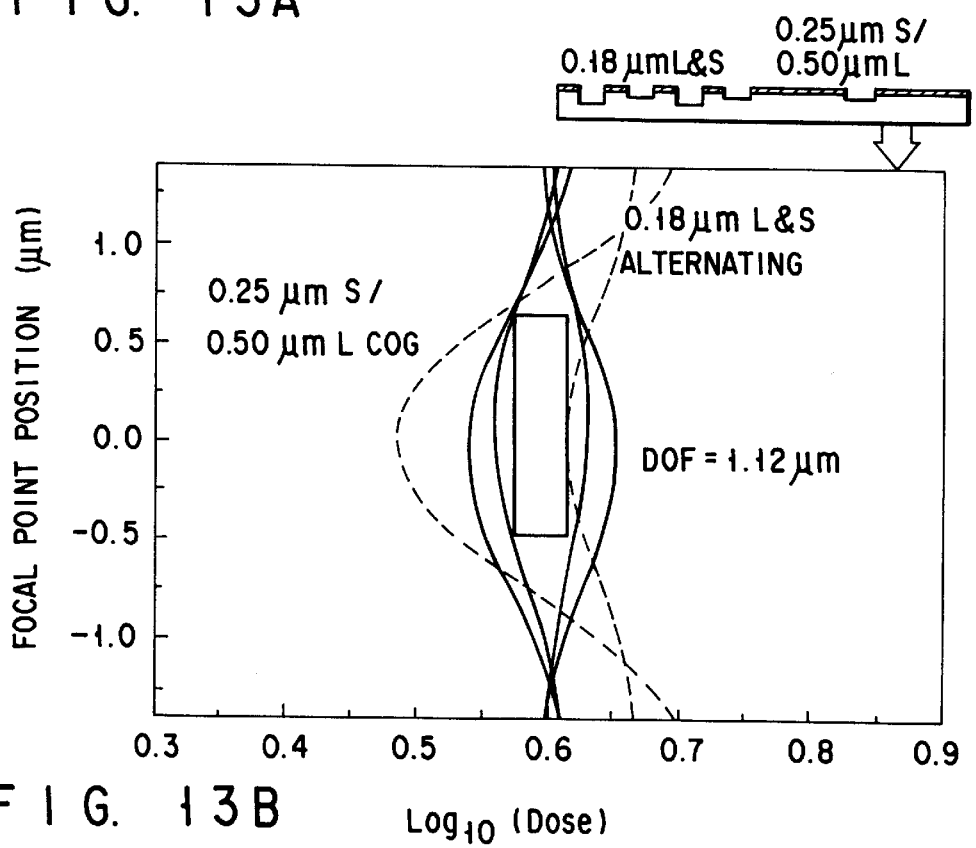

On the other hand, in a case where a mask having a similar pattern was formed so as to have the structure of FIG. 2B, a focal depth was 1.12 μm as shown in FIG. 13B.

It was found that the pattern structure used in the tenth embodiment achieved a greater focal depth when the non-Levenson region was formed so as to have an optical path difference of λ/2 with respect to the light passing through the transmissive substrate.

As shown in the tenth embodiment, when a region with (the opening portion:the shading portion)=about 1:2 exists in the non-Levenson region having the opening dimensions 1.5 times as large as those of the Levenson region, it is desirable that the region should be formed so as to have an optical path difference of λ/2 with respect to the light passing through the transmissive substrate. The same holds true for a case where the region does not depend on the exposure wavelength and its standardized dimensions are almost the same.

(Eleventh Embodiment)

A eleventh embodiment of the present invention relates to exposure masks manufactured by the same method as in the eighth embodiment. The exposure masks have the structure of FIG. 3C. Exposure was carried out using a KrF Excimer laser as a light source under the conditions of NA=0.5 and σ=0.5. The exposure mask produced in the eleventh embodiment was compared in transfer characteristic with an exposure mask having the structure of FIG. 3A.

As for the patterns on the mask, the Levenson method-applied region had a 0.18 μm L & S pattern and the Levenson method-unapplied region had a 0.25 μm L & S pattern.

A resist sensitive to a KrF Excimer laser was formed to a film thickness of 0.5 μm on a processed substrate. The processed substrate was such that the unevenness of the substrate resulting from interconnections had been flattened and then a film for decreasing the reflection of exposure light was provided on the smooth substrate.

FIG. 14A shows the focal depth in a case where the Levenson method-unapplied portion has the structure of FIG. 3A. The exposure conditions were as follows: NA=0.5, σ=0.5, the Levenson method-applied pattern=a 0.18 μm L & S pattern, and the Levenson method-unapplied pattern=a 0.25 μm L & S pattern). In FIGS. 14A and 14B, the focal depth is represented by a square, the logarithm of exposure is plotted on the abscissa axis, and the defocus position is plotted on the ordinate axis. The focal depth was determined, provided that allowable fluctuations in the exposure are up to 10% and fluctuations in the dimensions at that time are ±10% with respect to the desired values. The area enclosed by the square is the allowable range. As seen from FIG. 14A, any focal depth was not obtained at all in a case where the mask was formed so as to have the structure of FIG. 3A.

On the other hand, in a case where a mask having a similar pattern was formed so as to have the structure of FIG. 3C, a focal depth was 0.35 μm as shown in FIG. 14B.

It was found that the pattern structure used in the eleventh embodiment achieved a greater focal depth when the non-Levenson region was formed so as to have an optical path difference of λ with respect to the light passing through the transmissive substrate.

As shown in the eleventh embodiment, when a region with (the opening portion:the shading portion) about 1:1 exists in the non-Levenson region having the opening dimensions 1.5 times as large as those of the Levenson region, it is desirable that the region should be formed so as to have an optical path difference of λ with respect to the light passing through the transmissive substrate. The same holds true for a case where the region does not depend on the exposure wavelength and its standardized dimensions are almost the same.

(Twelfth Embodiment)

A twelfth embodiment of the present invention relates to a method of manufacturing exposure masks equivalent in performance to those of FIG. 2B for use with an ArF Excimer laser (with a wavelength of 193 nm), using the pattern data groups created in the first embodiment.

Figure 15A:
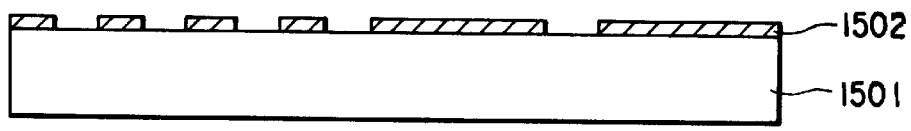
FIGS. 15A to 15G are sectional views of the first half of the steps of manufacturing phase-shift member deposit exposure masks according to a twelfth embodiment of the present invention using the mask data created in FIG. 5.

FIGS. 15A to 15G and FIGS. 16A to 16F are sectional views of the steps of manufacturing exposure masks in connection with the twelfth embodiment. First, a mask blank covered with a shading film composed of a CrON film 1502 was provided on one surface of a transmissive substrate 1501 made of quartz. On the shading film 1502 of the mask blank, a resin film sensitive to electron beam was formed. An image was drawn on the resin film by an electron beam using the first pattern data group created in the first embodiment and then was developed. Then, the exposed CrON film was etched away by cerium nitrate secondary ammonium solution. Thereafter, the photosensitive resin film was removed to form a shading film pattern (FIG. 15A).

Figure 15B:
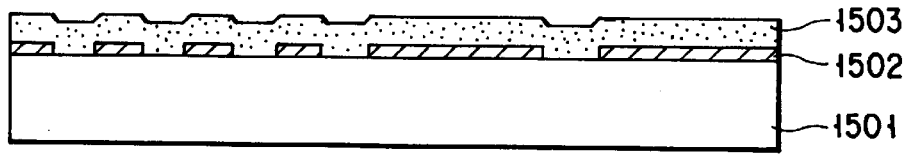
Figure 15C:
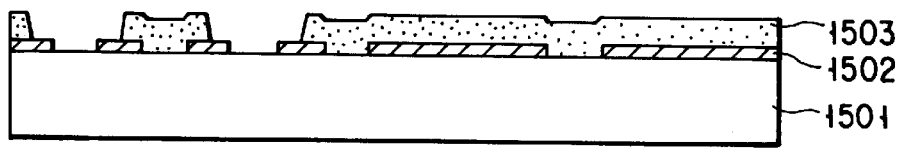

Then, a resin film 1503 sensitive to ultraviolet rays was formed on the substrate having the shading pattern (FIG. 15B). An image was drawn on the resin film 1503 by an ultraviolet beam using the second pattern data group created in the first embodiment and then was developed to form a resist pattern. The second pattern data group was made greater up to half the shading film width, when the shading film adjoined an opening (FIG. 15C).

Figure 15D:
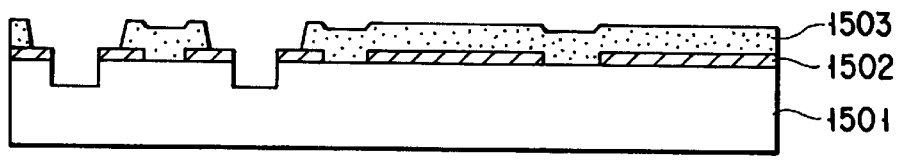
Figure 15E:
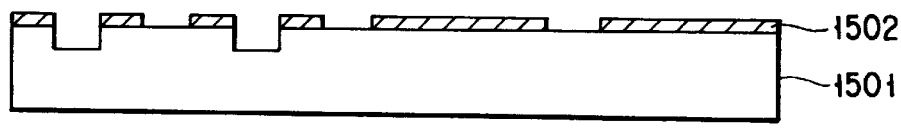

With the resist pattern as a mask, the transmissive substrate 1501 was etched about d=190 nm in depth by $CF_4$ gas (FIG. 15D). The amount of etching caused an optical path difference of $\lambda/2$ with respect to the exposure wavelength at the unetching surface with a refractive index of 1.5 at a depth of 193 nm of the transmissive substrate 1501.

Figure 15F:
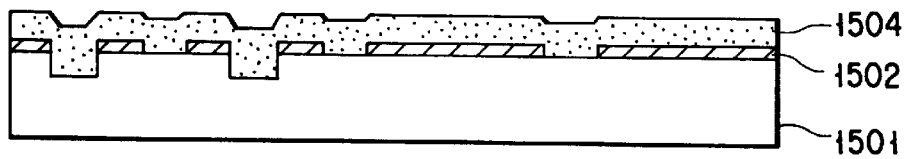
Figure 15G:
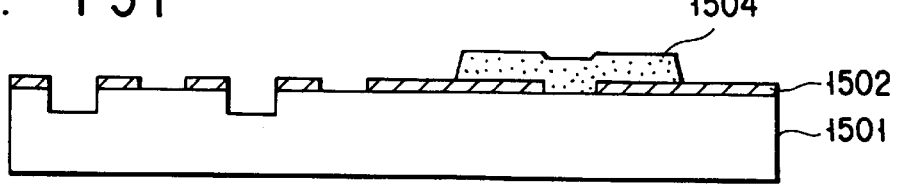

Next, the photosensitive resin film 1503 was removed (FIG. 15E) and a new photosensitive resin film 1504 was formed on the pattern surface (FIG. 15F). An image was drawn on the resin film 1504 by an ultraviolet beam using the third pattern data group created in the first embodiment and then was developed to form a resist pattern. The third pattern data group was made greater up to half the shading film width, when the shading film 1502 adjoined an opening (FIG. 15G).

With the resist pattern as a mask, the transmissive substrate was etched about 20 nm in depth by hydrofluoric acid (FIG. 16A). The amount of etching was determined so that the image intensity at the 210-nm-deep etched portion might be equal to that at the adjacent portions. Thereafter, the photosensitive resin film 1504 was removed (FIG. 16B).

Next, a new photosensitive resin film 1505 was formed on the pattern surface (FIG. 16C). The third pattern data group created in the first embodiment was inverted and the inverted data was modified so that the opening width might extend from the edge of the shading film 1502 onto the shading film 1502 adjacent to the transmissive substrate 1501. Using the thus obtained data, an image was drawn on the resin film 1505 by an ultraviolet beam and developed to form a resist pattern (FIG. 16D).

With the resist as a mask, the transmissive substrate was etched 190 nm in depth by fluorine-based gas (FIG. 16E). Thereafter, the photosensitive resin film was removed (FIG. 16F).

In the twelfth embodiment, after the state shown in FIG. 15D, an image may be drawn using the third pattern data group without removing the photosensitive resin film 1503 and be developed to form a resist pattern as in FIG. 15G. With the resist pattern as a mask, the transmissive substrate 1501 may be etched by hydrofluoric acid solution.

Although the twelfth embodiment relates to a method of manufacturing ArF Excimer laser exposure masks, the present invention is not limited to this. For instance, the invention may be applied to exposure masks used for I rays of the mercury lamp (365 nm), KrF Excimer laser (248 nm), or XeHg lamps (248 to 250 nm). In this case, the amount of etching (d) must be varied according to an exposure wavelength of $\lambda$ and a refractive index of n of the transmissive substrate at the exposure wavelength.

At that time, the amount of etching (d) should be determined by the following equation:

$$d=\lambda/(2(n-1))$$

While in the twelfth embodiment, quartz was used for the transmissive substrate, the present invention is not limited to this. For instance, $Si_3N_4$, $Al_2O_3$, $CaF_2$, or $HfO_2$ may be used in place of quartz. At that time, gas used in etching the transmissive substrate should be selected according to the material of the transmissive substrate.

Although a film containing CrON was used as a shading material, the invention is not restricted to this. For instance, a film containing MoSi or Si may be used.

In drawing for the formation of a mask pattern, an electron beam or an ultraviolet-light beam may be used as the need arises. When an electron beam is used after the formation of a shading pattern, however, it is desirable that exposure should be carried out after a conductive film has been formed on the top or bottom of the photosensitive resin film.

(Thirteenth Embodiment)

A thirteenth embodiment of the present invention relates to a method of manufacturing transparent shifter stacked exposure masks producing the same effect as those of FIG. 2B for use with an KrF Excimer laser (with a wavelength of 248 nm), using the pattern data groups created in the first embodiment.

FIGS. 17 and 18 are sectional views of the steps of manufacturing exposure masks in connection with the thirteenth embodiment. First, a mask blank covered with a shading film composed of a CrON film 1602 was provided on one surface of a transmissive substrate 1601 made of quartz. On the shading film 1602 of the mask blank, a resin film sensitive to electron beam was formed. An image was drawn on the resin film by an electron beam using the first pattern data group containing data on all of the openings and then was developed. Then, the exposed CrON film 1602 was etched away by cerium nitrate secondary ammonium solution. Thereafter, the photosensitive resin film was removed to form a shading film pattern (FIG. 17A).

Next, an $SiO_2$ film 1603 was formed to a thickness of 250 nm on the pattern surface by the CVD method.

Then, a resin film 1604 sensitive to ultraviolet rays was formed on the substrate having the shading pattern (FIG. 17C). The film was exposed to the exposure light passing through the undepositing (and unetching) portion of the transmissive substrate with a phase difference of 0 according to the second pattern data group containing data on the portions where the transmissive substrate was to be dug. The exposed film was developed to form a resist pattern. The second pattern data group was made greater up to half the minimum shading film width, when the shading film adjoined an opening (FIG. 17D).

With the resist pattern as a mask, the exposed CVD-$SiO_2$ film was etched by $CF_4$ gas (FIG. 17E). Thereafter, the photosensitive resin film used in the etching was removed (FIG. 17F).

Figure 18A:
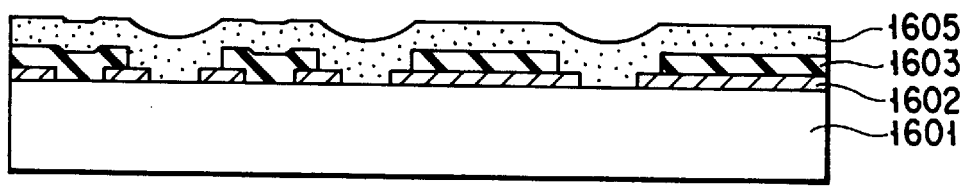
FIGS. 18A to 18D are sectional views of the second half of the steps of manufacturing phase-shift member deposit exposure masks according to the thirteenth embodiment using the mask data created in FIG. 5.
Figure 18B:
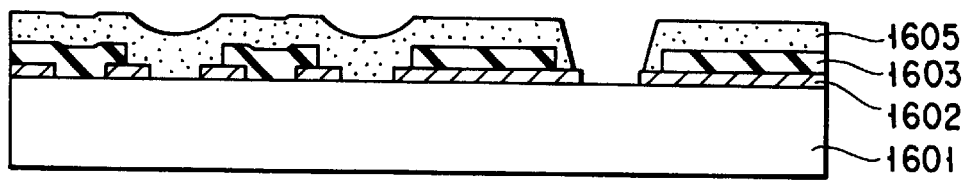

Then, a new photosensitive resin film 1605 was formed on the pattern (FIG. 18A). The resin film 1605 was exposed using the third pattern data group containing data on the portions where the transmissive substrate was to be dug and was developed to form a resist pattern. The third pattern data was made 0.1 µm greater than the shading film width, when the shading film adjoined the opening (FIG. 18B). The value of 0.1 µm was about twice the alignment accuracy of the drawing device.

Figure 18C:
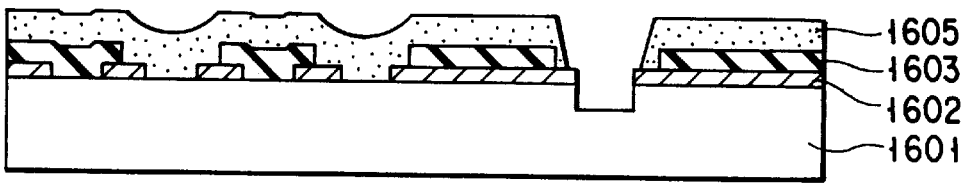
Figure 18D:
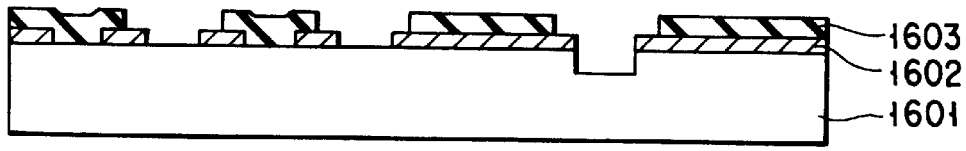

With the resist pattern as a mask, the transmissive substrate was etched about 248 nm in depth by $CF_4$ gas (FIG. 18C). The amount of etching caused an optical path difference of $\lambda/2$ in the exposure wavelength at the unetching surface with a refractive index of 1.5 at a depth of 248 nm of the transmissive substrate. Thereafter, the photosensitive resin film was removed to form a desired exposure mask (FIG. 18D).

Although the thirteenth embodiment relates to a method of manufacturing ArF Excimer laser exposure masks, the present invention is not limited to this. For instance, the invention may be applied to exposure masks used for I rays of the mercury lamp (365 nm), KrF Excimer laser (248 nm), or XeHg lamps (248 to 250 nm). In this case, the thickness d of the CVD-SiO$_2$ film must be varied according to an exposure wavelength of λ and a refractive index of n of the CVD-SiO$_2$ at the exposure wavelength.

At that time, the amount of etching (d) should be determined by the following equation:

$$d=\lambda/(2(n-1))$$

While in the thirteenth embodiment, quartz was used for the transmissive substrate, the present invention is not limited to this. For instance, Si$_3$N$_4$, Al$_2$O$_3$, CaF$_2$, or HfO$_2$ may be used in place of quartz. At that time, gas used in etching the transmissive substrate should be selected according to the material of the transmissive substrate.

The deposited phase shift member is not restricted to CVD-SiO$_2$, but may be made of Si$_3$N$_4$, Al$_2$O$_3$, CaF$_2$, or HfO$_2$ instead. In this case, gas used in etching the phase shift member should be selected according to the material of the transmissive substrate.

Although a film containing CrON was used as a shading material, the invention is not restricted to this. For instance, a film containing MoSi or Si may be used.

In drawing for the formation of a mask pattern, an electron beam or an ultraviolet-light beam may be used as needed. When an electron beam is used after the formation of a shading pattern, however, it is desirable that exposure should be carried out after a conductive film has been formed on the top or bottom of the photosensitive resin film.

(Fourteenth Embodiment)

A fourteenth embodiment of the present invention relates to a method of manufacturing transparent shifter stacked exposure masks producing the same effect as those of FIG. 2B for use with an ArF Excimer laser (with a wavelength of 193 nm), using the pattern data groups created in the first embodiment.

Figure 19A:
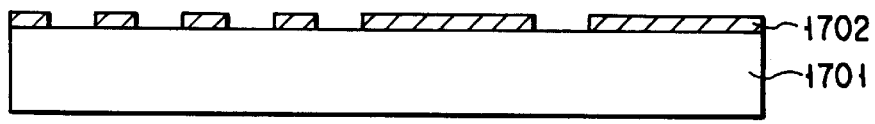
FIGS. 19A to 19H are sectional views of the steps of manufacturing phase-shift member deposit exposure masks according to a fourteenth embodiment of the present invention using the mask data created in FIG. 5.
Figure 19B:
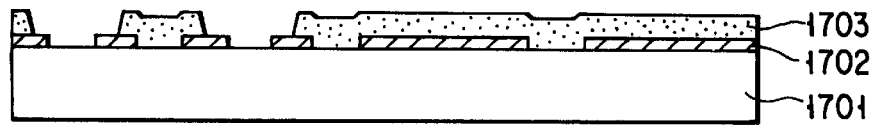

FIGS. 19A to 19H are sectional views of the steps of manufacturing exposure masks in connection with the fourteenth embodiment. First, a mask blank covered with a shading film composed of a CrON film 1702 was provided on one surface of a transmissive substrate 1701 made of quartz. On the shading film 1702 of the mask blank, a resin film sensitive to electron beam was formed. An image was drawn on the resin film by an electron beam using the first pattern data group containing data on all of the openings and then was developed. Then, the exposed CrON film 1702 was etched away by cerium nitrate secondary ammonium solution. Thereafter, the photosensitive resin film was removed to form a shading film pattern (FIG. 19A).

Next, a resin film 1703 sensitive to ultraviolet rays was formed on the substrate surface having a shading pattern. The film was exposed to the exposure light passing through the undepositing (and unetching) portion of the transmissive substrate with a phase difference of 0 according to the second pattern data group containing data on the portions where the transmissive substrate was to be dug. The exposed film was developed to form a resist pattern. The second pattern data group was made greater up to half the shading film width, when the shading film 1702 adjoined an opening (FIG. 19D).

Figure 19C:
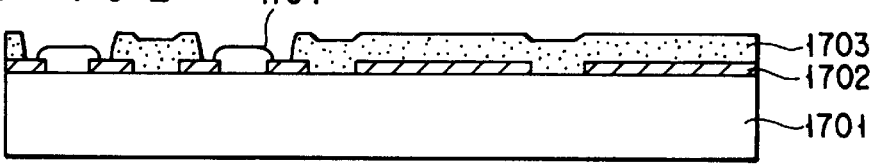
Figure 19D:
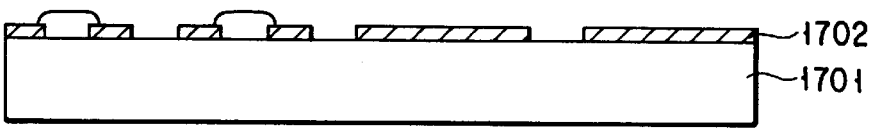

With the resist pattern as a mask, an SiO$_2$ film 1704 was selectively deposited to a thickness of d=195 nm on the exposed transparent substrate surface (FIG. 19C). Taking into account a refractive index of 1.49 at a depth of 193 nm of the deposited SiO$_2$ film 1704, the film thickness at that time was such as to cause an optical path difference of about λ/2 with respect to the exposure wavelength of the exposure light passing through the undepositing (and unetching) surface of the transmissive substrate 1701.

Figure 19E:
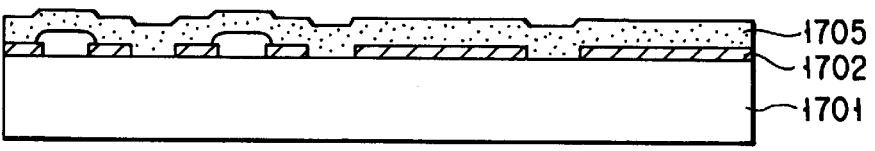
Figure 19F:
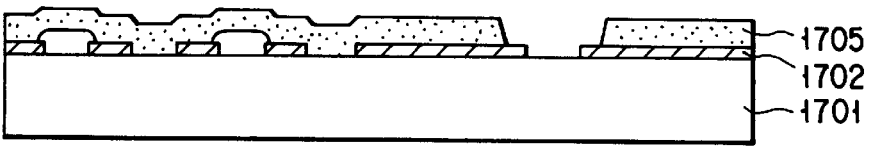

Then, the photosensitive resin film 1703 was removed (FIG. 19D) and a new photosensitive resin film 1705 was formed on the pattern surface (FIG. 19E). The resin film 1705 was exposed using the third pattern data group containing data on the portions where the transmissive substrate was to be dug and was developed to form a resist pattern. The third pattern data was made 0.1 μm greater than the shading film width, when the shading film 1702 adjoined an opening (FIG. 19F). The value of 0.1 μm was about twice the alignment accuracy of the drawing device.

Figure 19G:
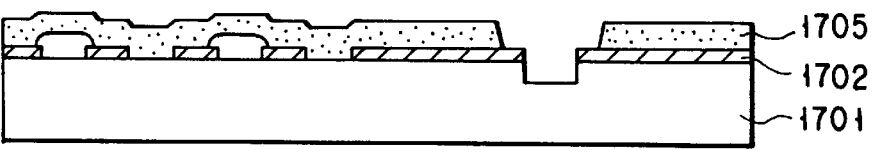
Figure 19H:
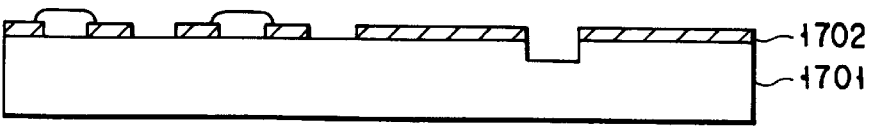

With the resist pattern as a mask, the transmissive substrate was etched about 190 nm in depth by CF$_4$ gas (FIG. 19G). The amount of etching caused an optical path difference of λ/2 with respect to the exposure wavelength at the unetching surface with a refractive index of 1.5 at a depth of 193 nm of the transmissive substrate 1701. Thereafter, the photosensitive resin film 1705 was removed to form a desired exposure mask (FIG. 19H)

Although the fourteenth embodiment relates to a method of manufacturing ArF Excimer laser exposure masks, the present invention is not limited to this. For instance, the invention may be applied to exposure masks used for I rays of the mercury lamp (365 nm), KrF Excimer laser (248 nm), or XeHg lamps (248 to 250 nm). In this case, the amount of deposit (d) of the SiO$_2$ film must be varied according to an exposure wavelength of λ and a refractive index of n of the transmissive substrate at the exposure wavelength.

At that time, the amount of etching (d) should be determined by the following equation:

$$d=\lambda/(2(n-1))$$

While in the fourteenth embodiment, quartz was used for the transmissive substrate, the present invention is not limited to this. For instance, Si$_3$N$_4$, Al$_2$O$_3$, CaF$_2$, or HfO$_2$ may be used in place of quartz. At that time, gas used in etching the transmissive substrate should be selected according to the material of the transmissive substrate.

In place of the deposited SiO$_2$ film on the transmissive substrate, Si$_3$N$_4$, Al$_2$O$_3$, CaF$_2$, or HfO$_2$ may be used. In this case, gas used in etching the deposited film should be selected according to the material of the transmissive substrate.

Although a film containing CrON was used as a shading material, the invention is not restricted to this. For instance, a film containing MoSi or Si may be used.

In drawing for the formation of a mask pattern, an electron beam or an ultraviolet-light beam may be used as needed. When an electron beam is used after the formation of a shading pattern, however, it is desirable that exposure should be carried out after a conductive film has been formed on the top or bottom of the photosensitive resin film.

As so far described in detail, the image intensity, which was adjusted by the exposure mask in the prior art, is adjusted by the adjustment of the amount of dig in the transmissive substrate, not by the adjustment of the opening width, which enables the adjustment of the exposure to the desired value for both of the Levenson method-applied pattern and the Levenson method-unapplied pattern.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. An exposure mask comprising a phase shift area and a non-phase shift area, said areas including openings formed in a shading film provided on a transmissive substrate, exposure light beams passing through adjacent ones of the openings of the phase shift area having a phase difference of substantially 180°, and exposure light beams passing through adjacent ones of the openings of the non-phase shift area having a phase difference of substantially 0°; and wherein said openings of the non-phase shift area comprise diggings in order to reduce the light intensity of the exposure light beams transmitting the openings of the non-phase shift area.

2. An exposure mask according to claim 1, wherein said shading film is made of a chrome compound, molybdenum silicide compound, or silicon compound.

3. An exposure mask according to claim 1, wherein said transmissive substrate is made of silicon dioxide ($SiO_2$), calcium difluoride ($CaF_2$), magnesium difluoride ($MgF_2$), or aluminum ($Al_2O_3$).

* * * * *